US011562936B2

(12) United States Patent
Son et al.

(10) Patent No.: US 11,562,936 B2
(45) Date of Patent: Jan. 24, 2023

(54) ELECTRIONIC DEVICES WITH INTERPOSER AND REDISTRIBUTION LAYER

(71) Applicant: Amkor Technology Singapore Holding Pte. Ltd., Singapore (SG)

(72) Inventors: Seung Nam Son, Seoul (KR); Dong Hyun Khim, Incheon (KR); Jin Kun Yoo, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 17/008,239

(22) Filed: Aug. 31, 2020

(65) Prior Publication Data

US 2022/0068739 A1 Mar. 3, 2022

(51) Int. Cl.
| | |
|---|---|
| *H01L 23/31* | (2006.01) |
| *H01L 23/492* | (2006.01) |
| *H01L 23/373* | (2006.01) |
| *H01L 23/40* | (2006.01) |

(52) U.S. Cl.
CPC .......... *H01L 23/31* (2013.01); *H01L 23/3735* (2013.01); *H01L 23/4926* (2013.01); *H01L 2023/4087* (2013.01)

(58) Field of Classification Search
CPC ....................................................... H01L 23/31
USPC ......................................... 257/678; 438/106
See application file for complete search history.

(56) References Cited

U.S. PATENT DOCUMENTS

| | | | |
|---|---|---|---|
| 8,659,151 B2 | 2/2014 | Ino | |
| 9,633,974 B2 | 4/2017 | Zhai et al. | |
| 9,711,485 B1 | 7/2017 | Berry et al. | |
| 2003/0164555 A1* | 9/2003 | Tong | ...................... H01L 24/29 257/787 |
| 2004/0036172 A1* | 2/2004 | Azuma | ............... H01L 23/4334 257/738 |
| 2006/0175702 A1* | 8/2006 | Ishibashi | ............. H01L 23/3128 257/738 |

(Continued)

FOREIGN PATENT DOCUMENTS

| | | |
|---|---|---|
| JP | 3500995 B2 | 2/2004 |
| JP | 5215605 B2 | 6/2013 |

(Continued)

*Primary Examiner* — Ajay Arora
(74) *Attorney, Agent, or Firm* — Spectrum IP Law Group LLC

(57) ABSTRACT

In one example, an electronic device comprises a base substrate comprising a base substrate conductive structure, a first electronic component over a first side of the base substrate, an encapsulant over the first side of the base substrate, wherein the encapsulant contacts a lateral side of the electronic component, an interposer substrate over a first side of the encapsulant and comprising an interposer substrate conductive structure, and a vertical interconnect in the encapsulant and coupled with the base substrate conductive structure and the interposer substrate conductive structure. A first one of the base substrate or the interposer substrate comprises a redistribution layer (RDL) substrate, and a second one of the base substrate or the interposer substrate comprises a laminate substrate. Other examples and related methods are also disclosed herein.

22 Claims, 23 Drawing Sheets

(56) References Cited

U.S. PATENT DOCUMENTS

| | | | |
|---|---|---|---|
| 2007/0108611 A1* | 5/2007 | Bartley | ............... H05K 1/141 |
| | | | 257/738 |
| 2011/0318878 A1 | 12/2011 | Tanaka | |
| 2018/0277485 A1 | 9/2018 | Han et al. | |
| 2019/0067038 A1 | 2/2019 | Yoo et al. | |
| 2019/0189572 A1* | 6/2019 | Chiang | ............... H01Q 1/2283 |

FOREIGN PATENT DOCUMENTS

| KR | 1020170086377 A | 7/2017 |
|---|---|---|
| KR | 102034391 B1 | 10/2019 |

\* cited by examiner

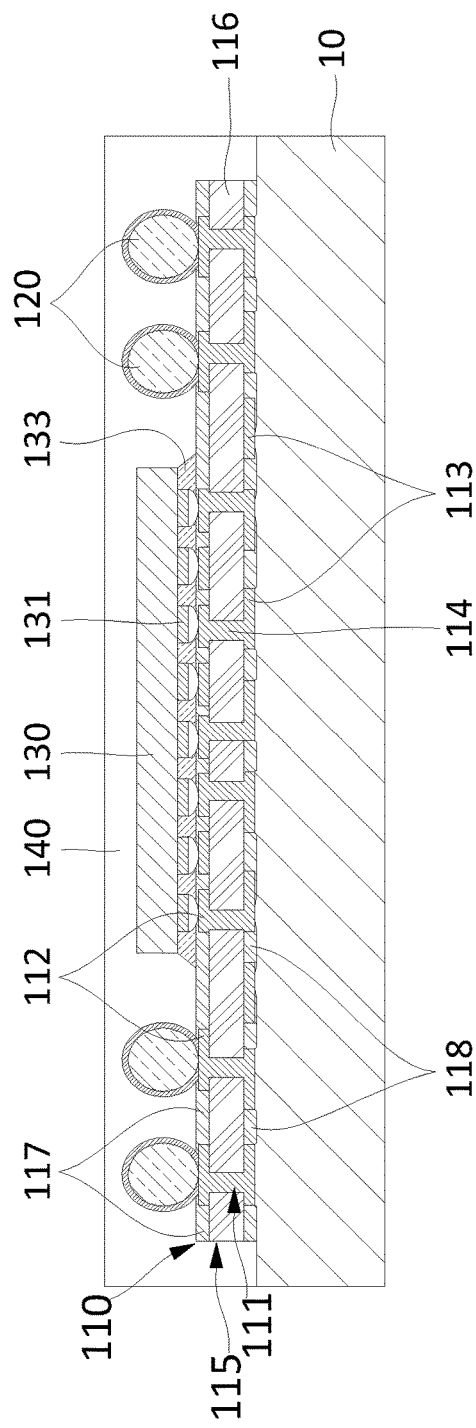
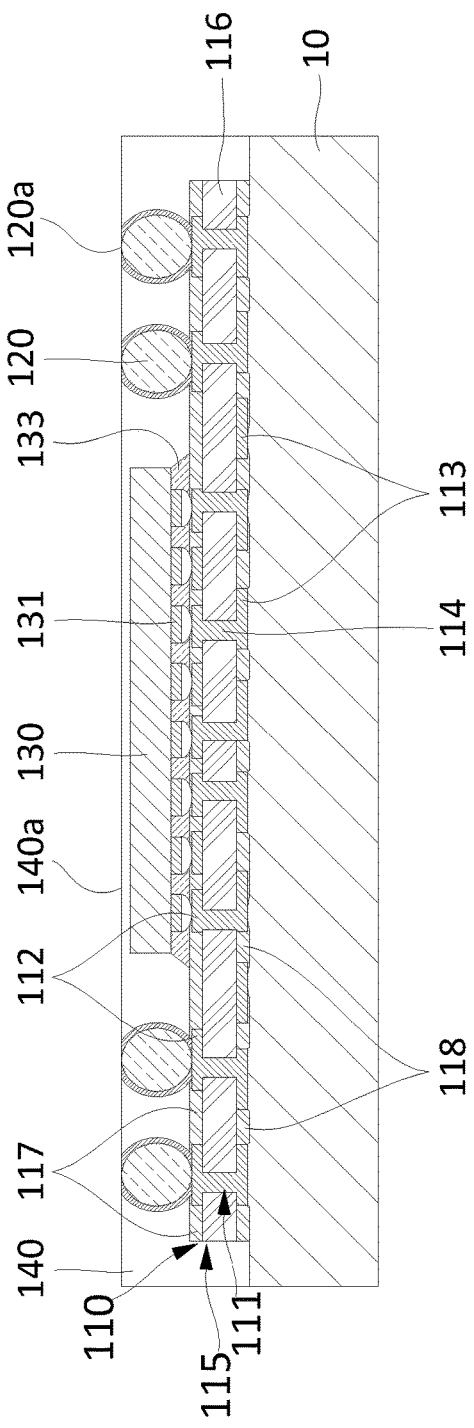
FIG.2G
FIG.2H

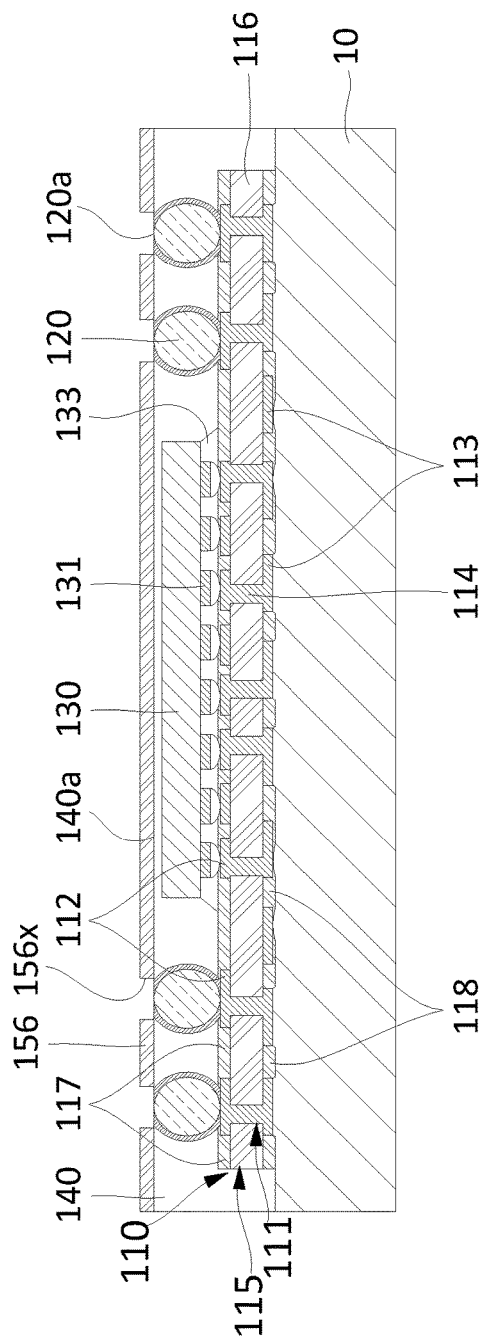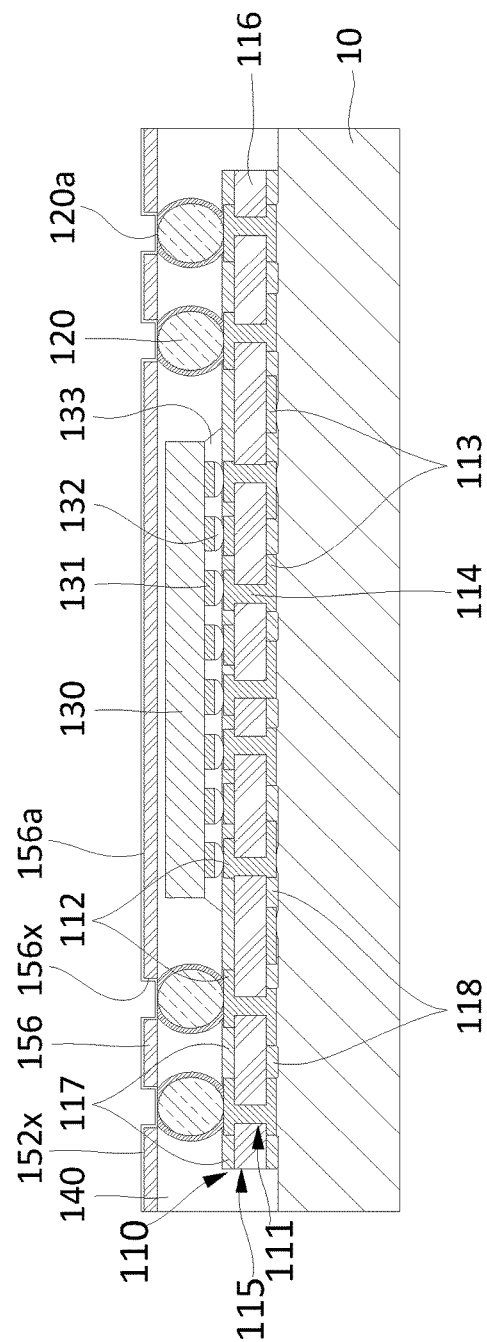

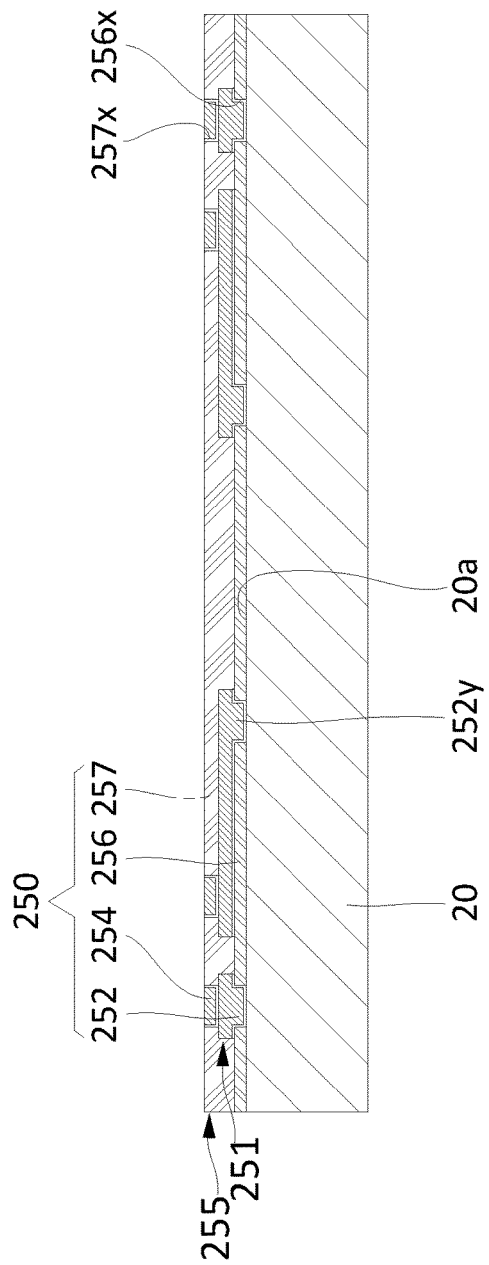
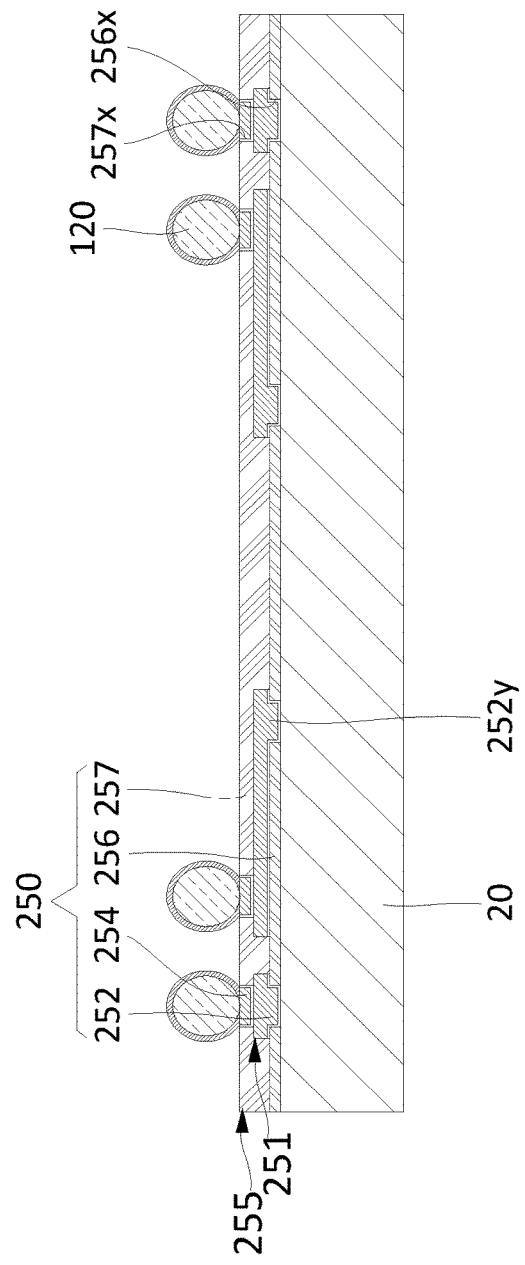

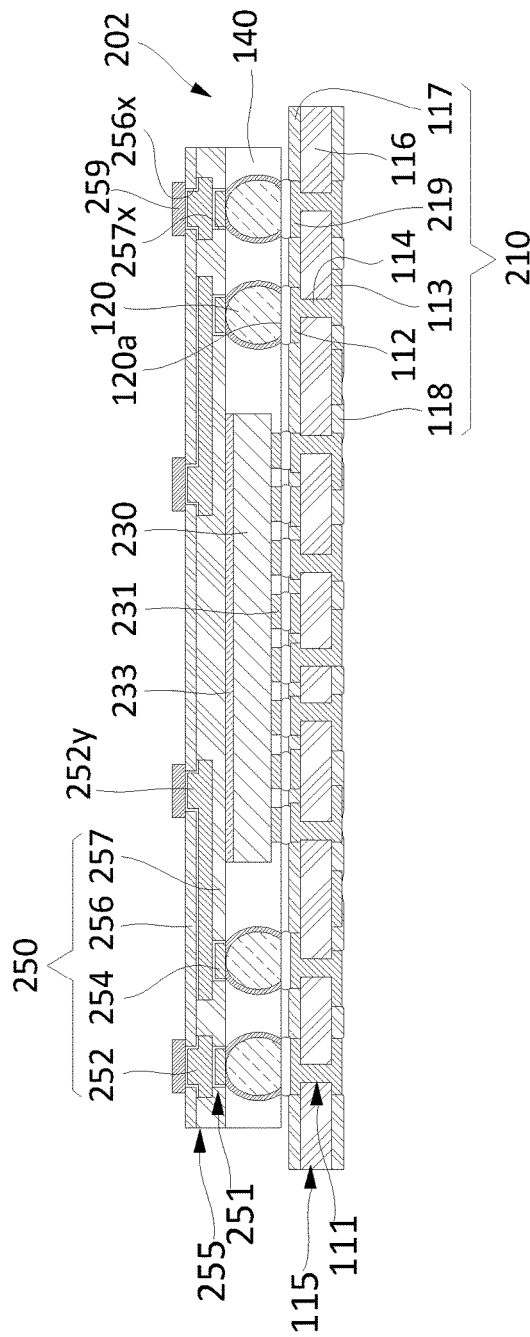
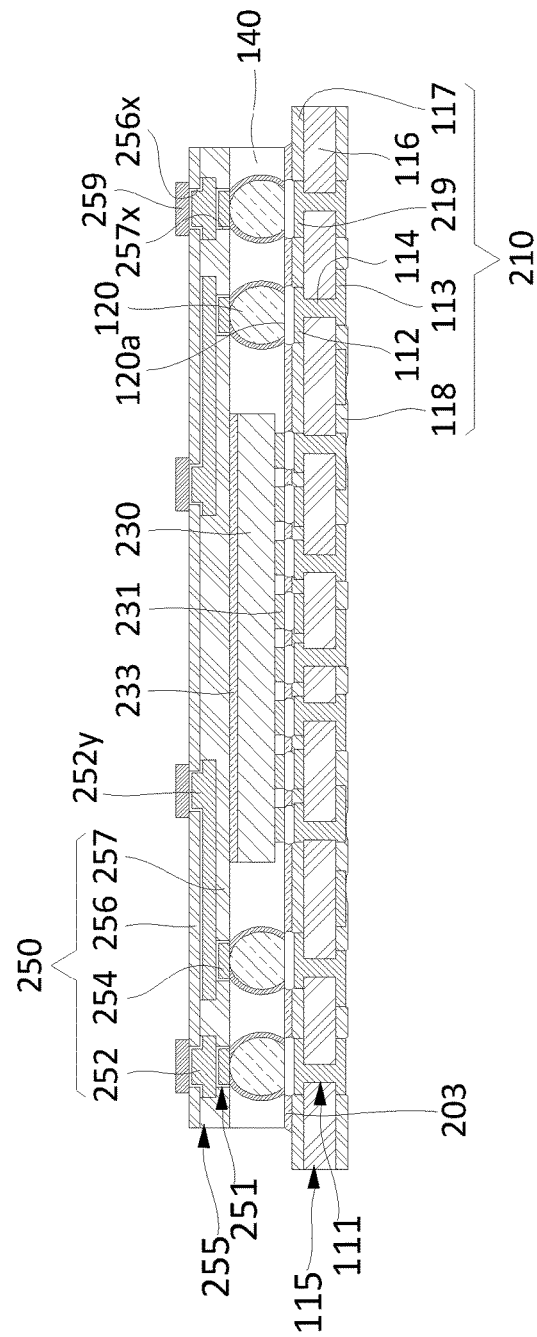
FIG.4G
FIG.4H

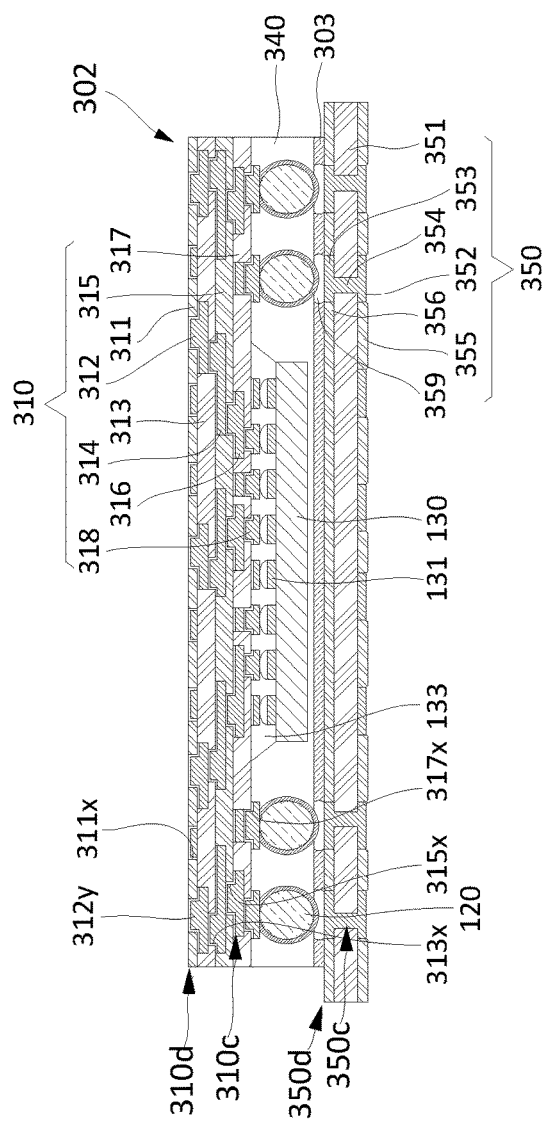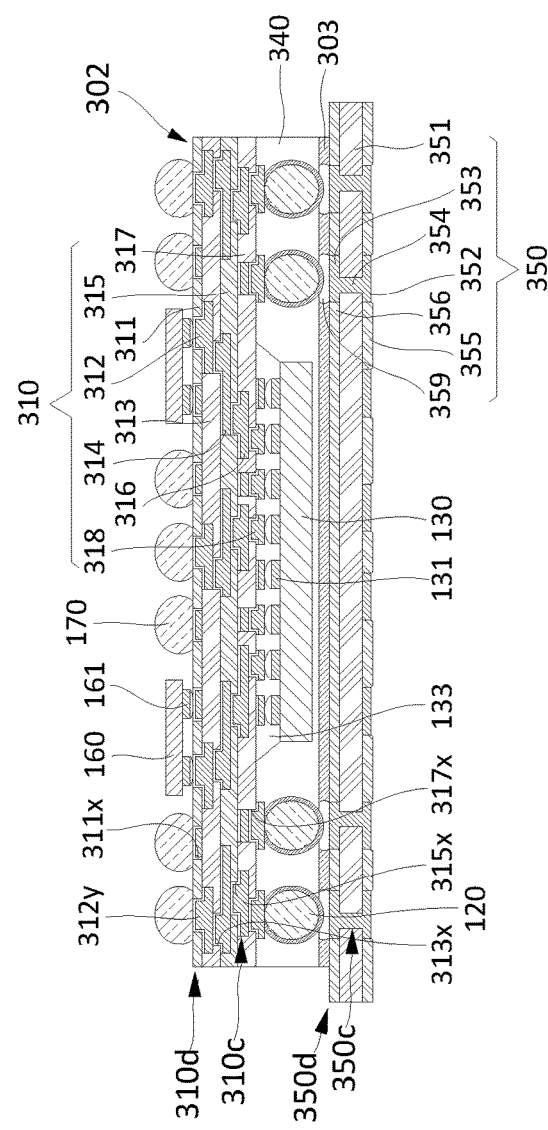

ELECTRIONIC DEVICES WITH INTERPOSER AND REDISTRIBUTION LAYER

TECHNICAL FIELD

The present disclosure relates, in general, to electronic devices, and more particularly, to semiconductor devices and methods for manufacturing semiconductor devices.

BACKGROUND

Prior electronic packages and methods for forming electronic packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 4A to 4J show cross-sectional views of an example method for manufacturing an example electronic device.

FIGS. 6A to 6I show cross-sectional views of an example method for manufacturing an example electronic device.

Figure 1:
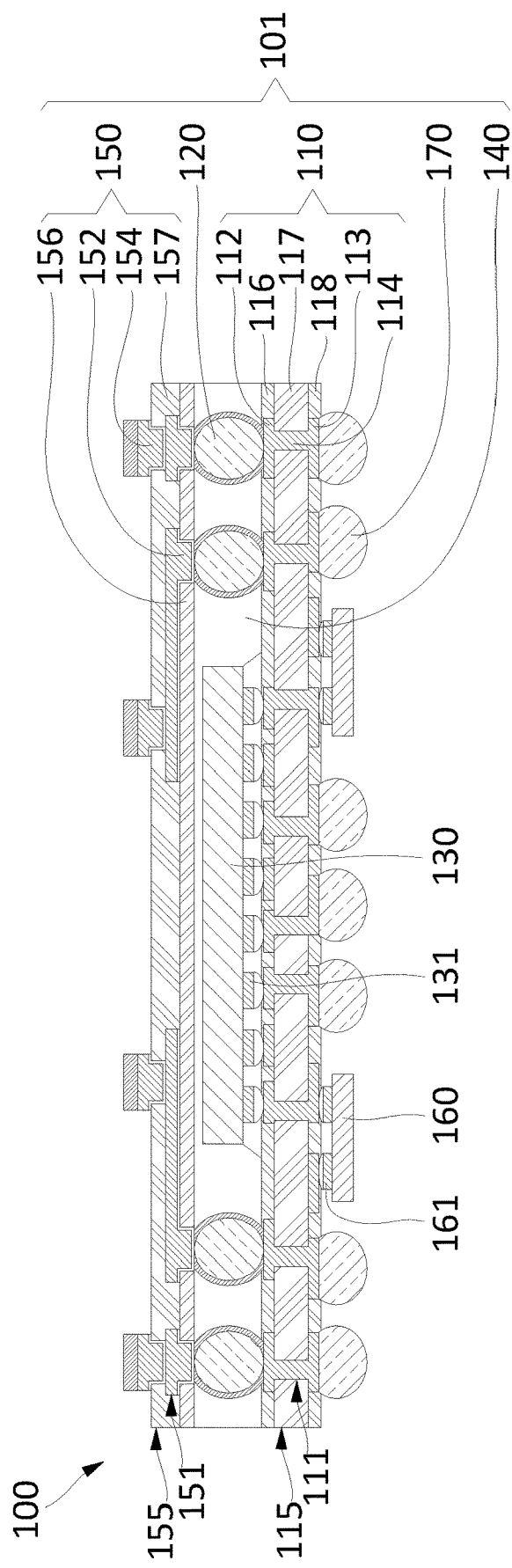
FIG. 1 shows a cross-sectional view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. Elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. For example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In a first example, an electronic device comprises a base substrate comprising a base substrate conductive structure, a first electronic component over a first side of the base substrate, an encapsulant over the first side of the base substrate, wherein the encapsulant contacts a lateral side of the electronic component, an interposer substrate over a first side of the encapsulant and comprising an interposer substrate conductive structure, and a vertical interconnect in the encapsulant and coupled with the base substrate conductive structure and the interposer substrate conductive structure. A first one of the base substrate or the interposer substrate comprises a redistribution layer (RDL) substrate; and a second one of the base substrate or the interposer substrate comprises a laminate substrate.

In another example, a method to manufacture an electronic device comprises providing a base substrate comprising a base substrate conductive structure, providing a first electronic component over a first side of the base substrate, providing a vertical interconnect over the first side of the base substrate and coupled with the base substrate conductive structure, providing an encapsulant over the first side of the base substrate, wherein the encapsulant contacts a lateral side of the electronic component and the vertical interconnect, and providing an interposer substrate over a first side of the encapsulant and comprising an interposer substrate conductive structure, wherein the interposer substrate conductive structure is coupled with the vertical interconnect. A first one of the base substrate or the interposer substrate comprises a redistribution layer (RDL) substrate, and a second one of the base substrate or the interposer substrate comprises a laminate substrate.

In a further example, a method to manufacture an electronic device comprises providing a first substrate comprising a first substrate conductive structure, wherein the first substrate comprises a redistribution layer (RDL) substrate, providing a vertical interconnect over a first side of the first substrate and coupled with the first substrate conductive structure, providing an electronic component over the first substrate and coupled with the first substrate, providing an encapsulant over the first side of the first substrate and contacting a lateral side of the electronic component and the vertical interconnect, coupling the vertical interconnect with a second conductive structure of a second substrate, and providing an underfill between the electronic component and the second substrate.

Other examples are included in the present disclosure. Such examples may be found in the figures, in the claims, or in the description of the present disclosure.

FIG. 1 shows a cross-sectional view of an example electronic device 100. In the example shown in FIG. 1, electronic device 100 can comprise base substrate 110, vertical interconnects 120, electronic component 130, encapsulant 140, interposer substrate 150, electronic component 160, and external interconnects 170.

Base substrate 110 can comprise conductive structure 111 and dielectric structure 115.

Conductive structure 111 can comprise several elements such as conductive elements 112, 113, or 114.

Dielectric structure 115 can comprise several elements such as dielectric elements 116, 117, or 118.

Electronic components 130 and 160 can comprise component terminals 131 and 161, respectively.

Interposer substrate 150 can comprise conductive structure 151 and dielectric structure 155.

Conductive structure 151 can comprise several elements such as conductive elements 152, 153, or 154.

Dielectric structure 155 can comprise several elements such as dielectric elements 156 or 157.

Base substrate 110 can comprise conductive structure 111 which can be referred to as a base substrate conductive structure. Interposer substrate 150 can comprise conductive structure 151 which can be referred to as an interposer substrate conductive structure. Base substrate 110, vertical interconnects 120, encapsulant 140, interposer substrate 150 and external interconnects 170 can comprise or be referred to as electronic package 101 or package 101. Electronic package 101 can provide protection for electronic components 130 and 160 from external elements or environmental exposure. Electronic package 101 can provide electrical routing between an external component or another electronic package and electronic components 130,160.

Figure 2A:
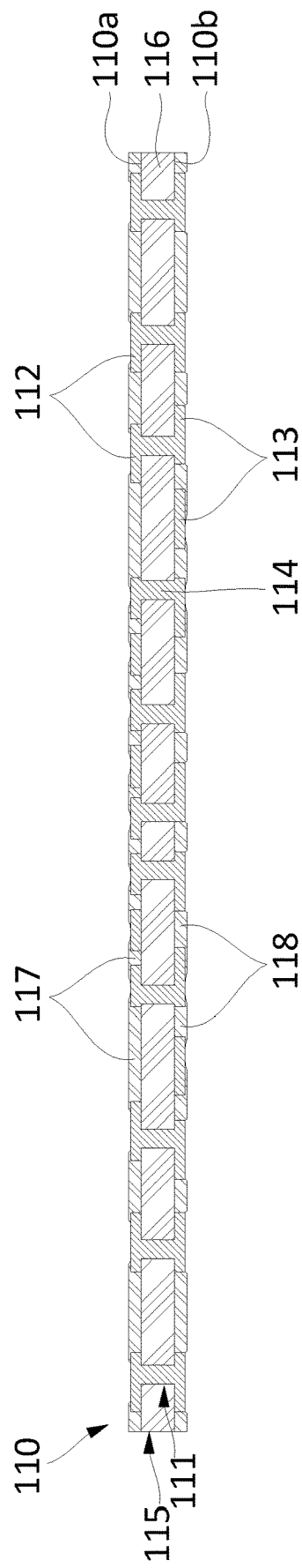
FIGS. 2A to 2Q show cross-sectional views of an example method for manufacturing an example electronic device.
Figure 2B:
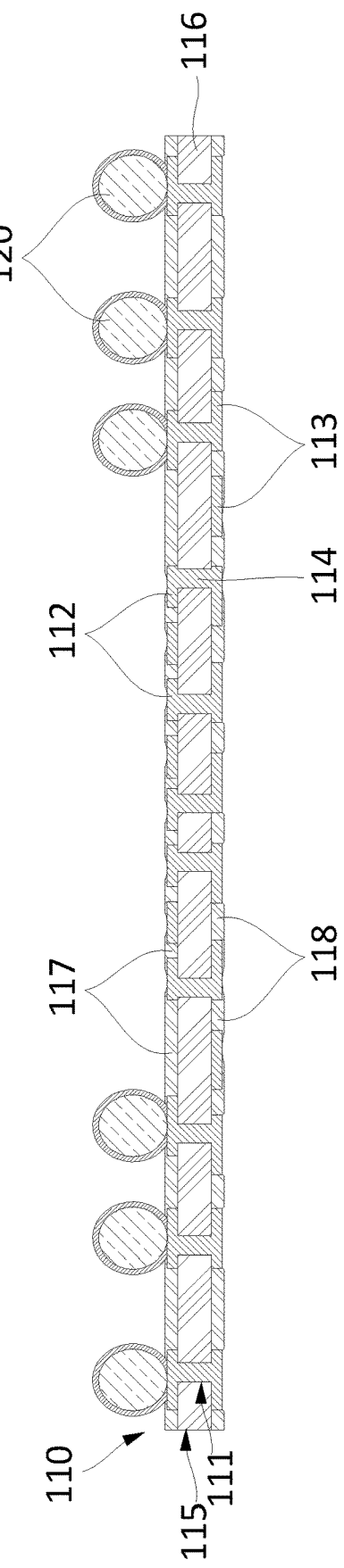
Figure 2C:
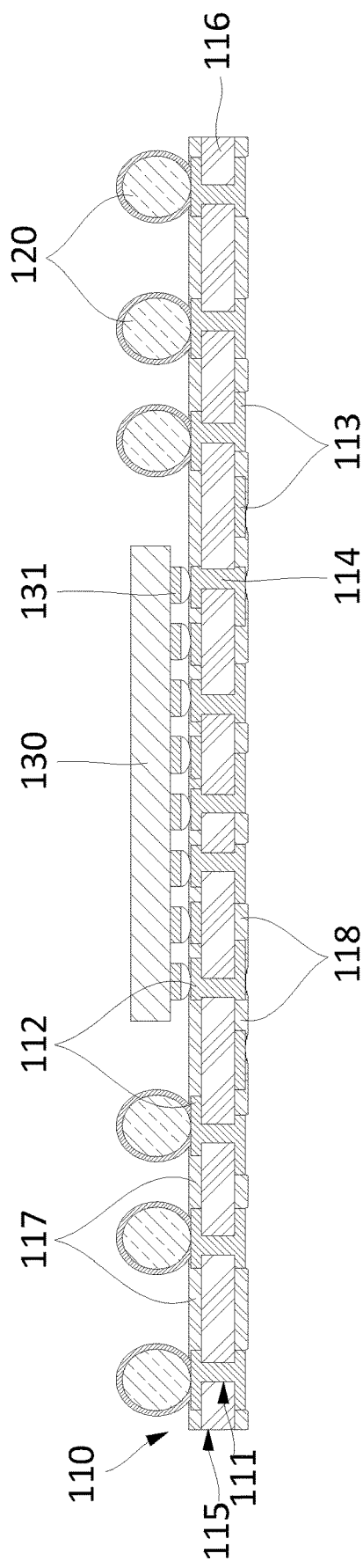
Figure 2D:
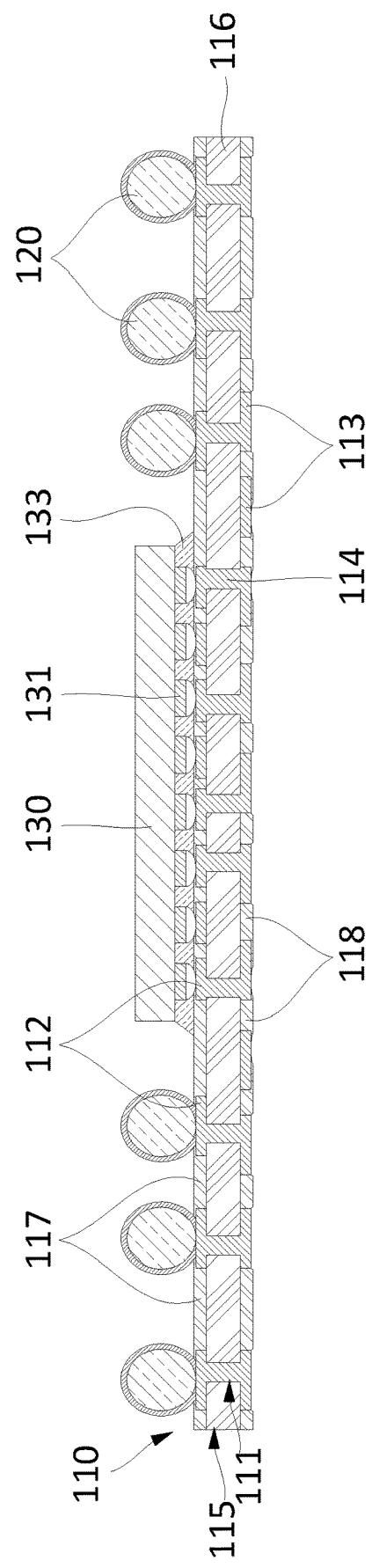
Figure 2E:
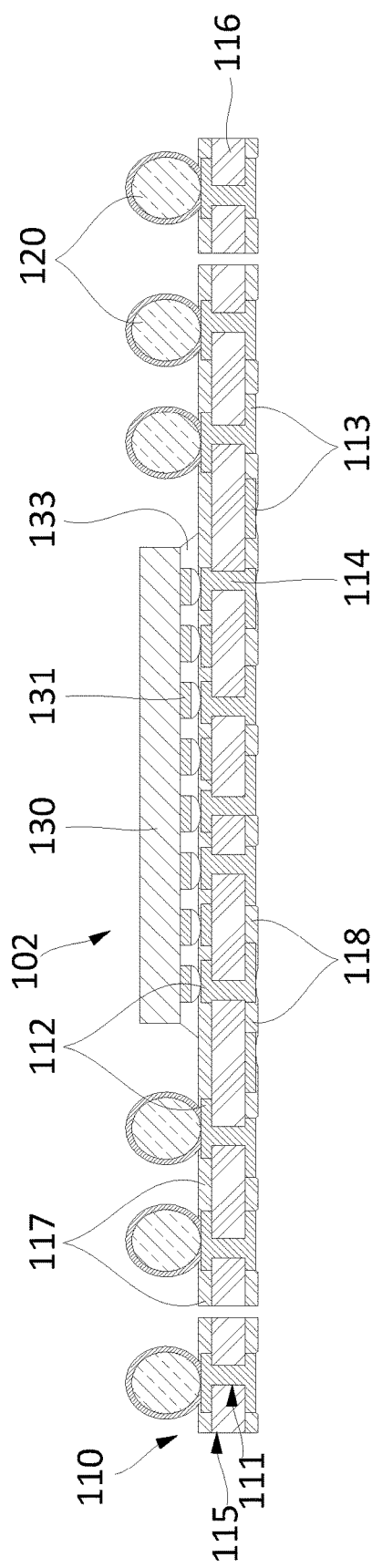
Figure 2F:
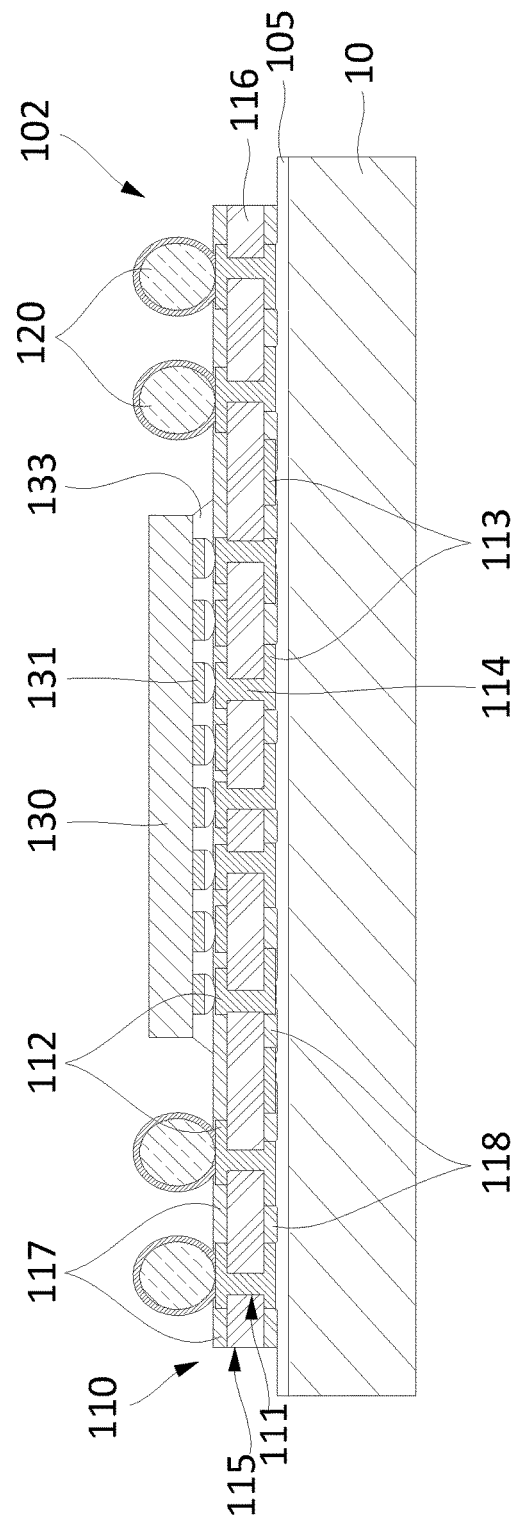
Figure 2K:
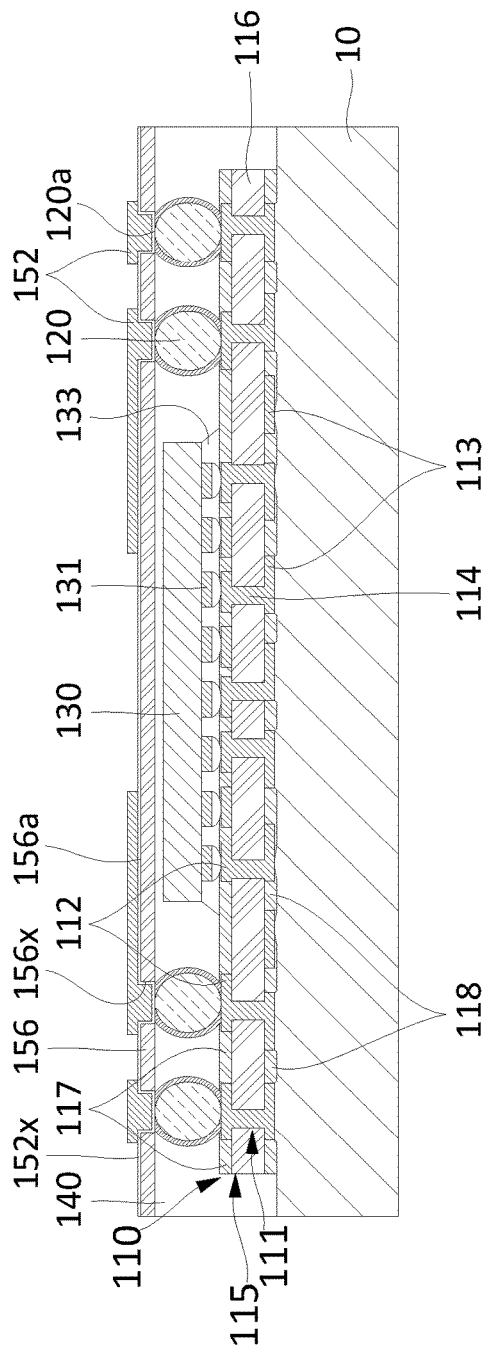
Figure 2L:
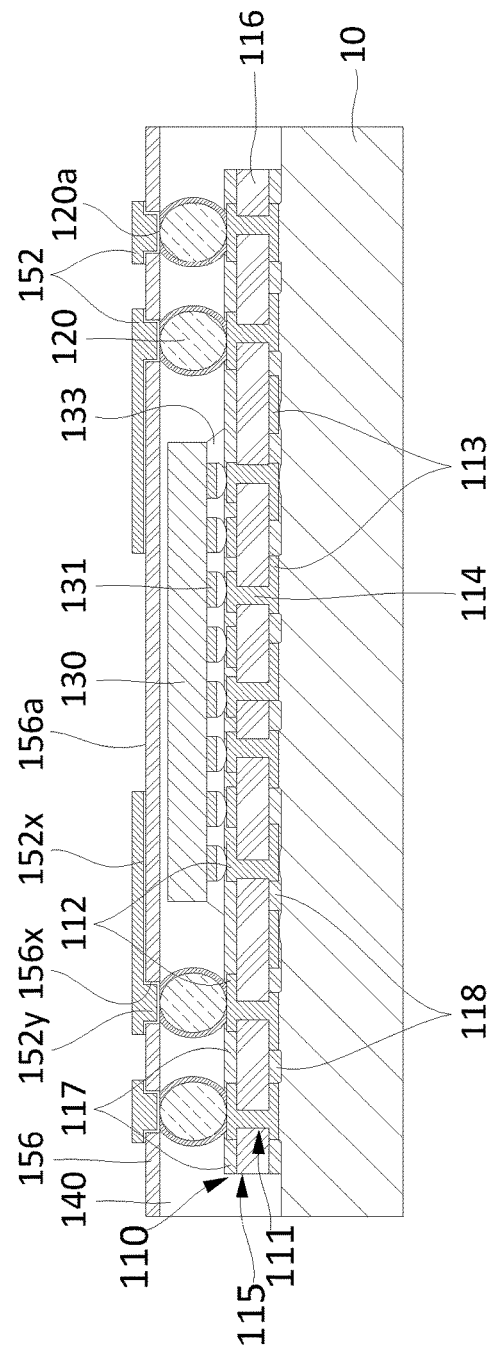
Figure 2M:
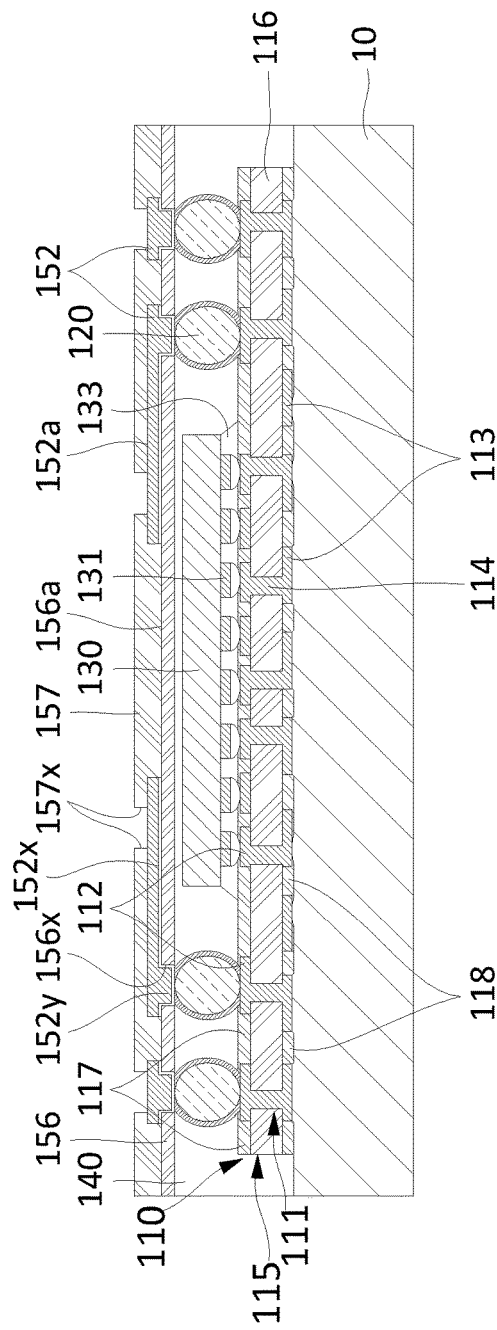
Figure 2N:
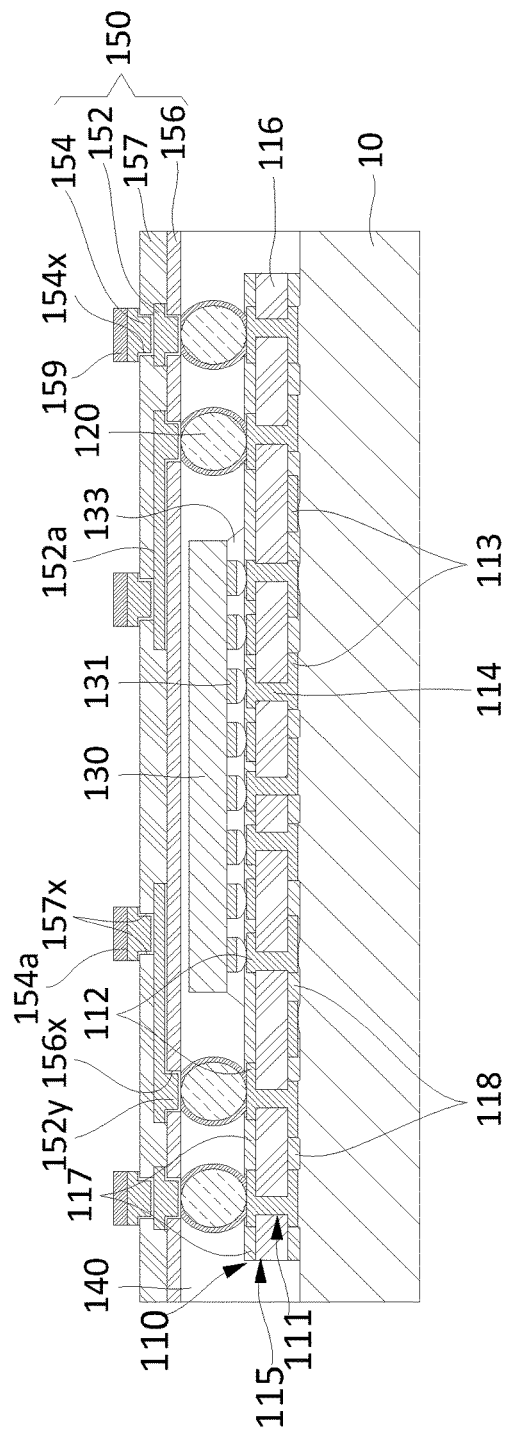
Figure 2O:
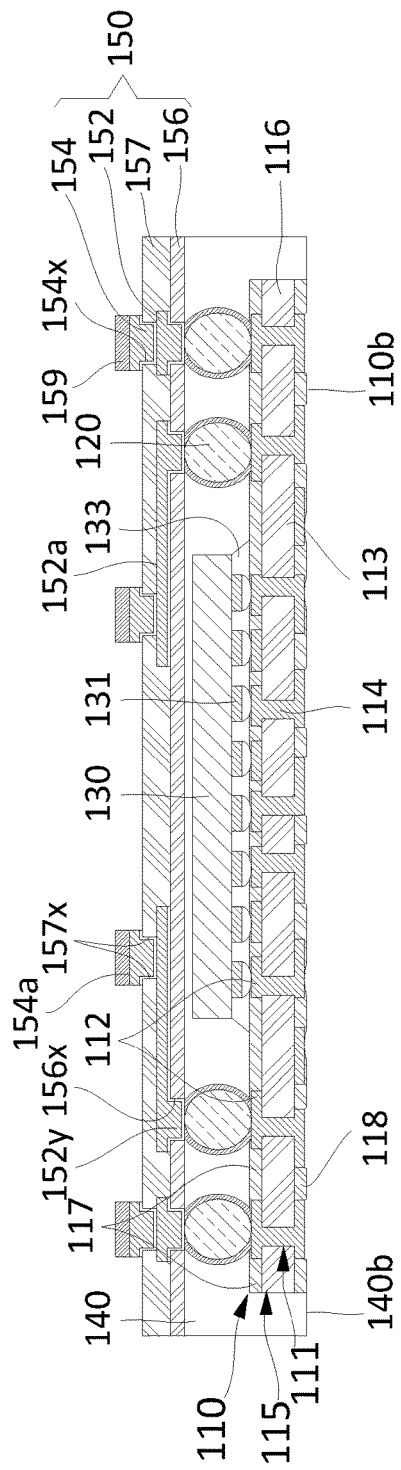
Figure 2P:
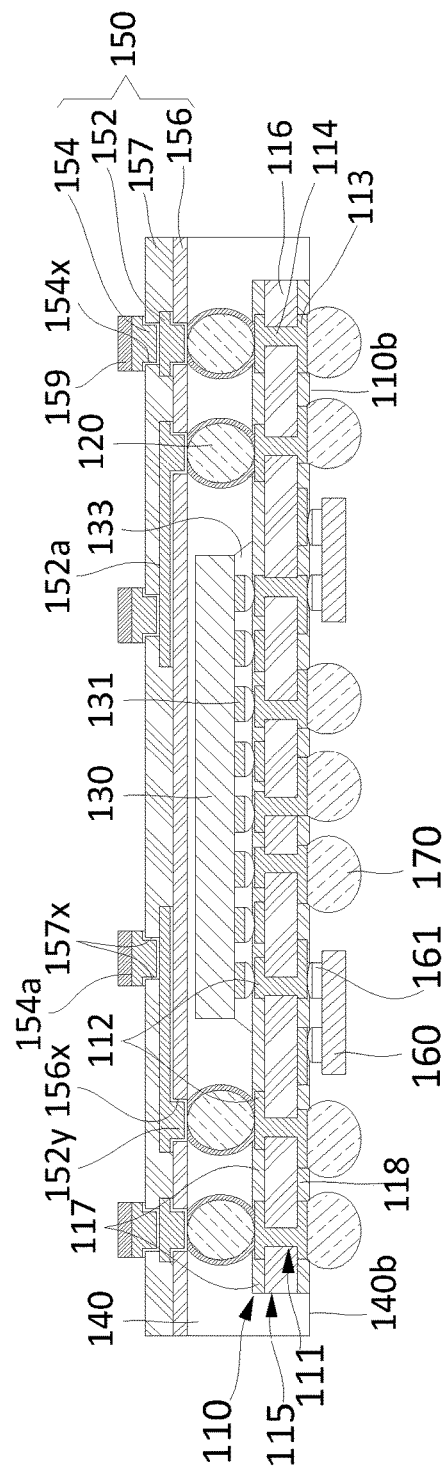
Figure 2Q:
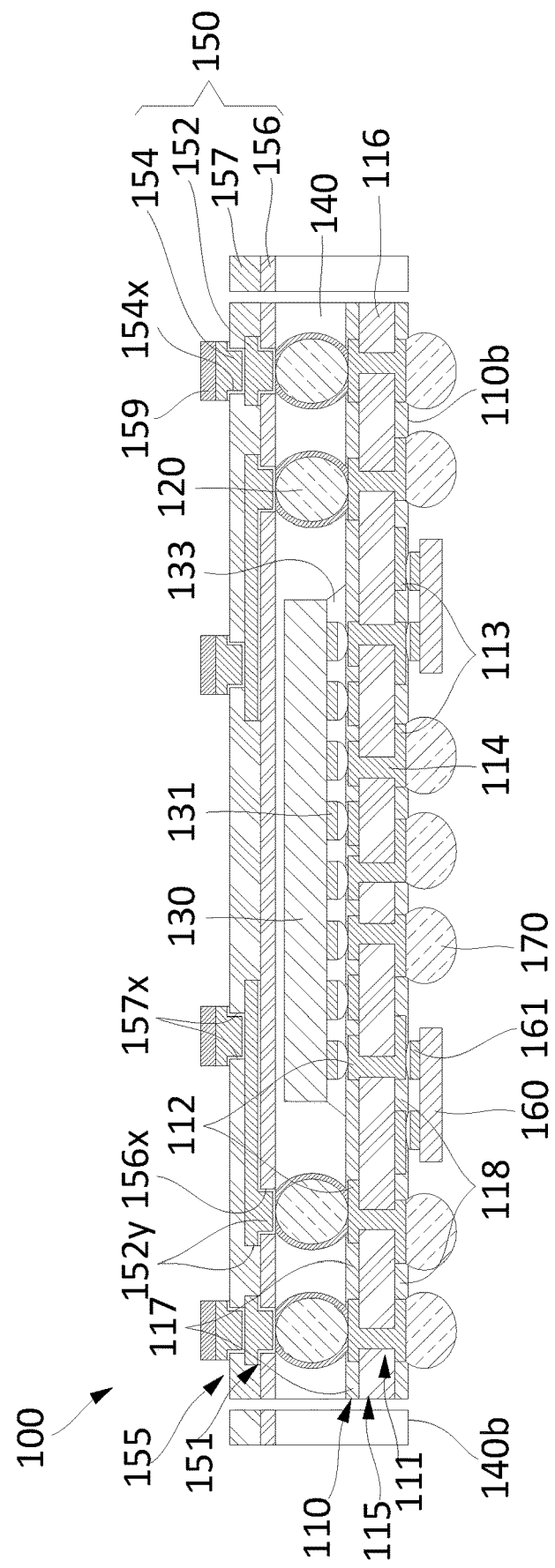

FIGS. 2A to 2Q show cross-sectional views of an example method for manufacturing example electronic device 100. FIG. 2A shows a cross-sectional view of electronic device 100 at an early stage of manufacture. In the example shown in FIG. 2A, base substrate 110 can comprise dielectric structure 115 and conductive structure 111. There also can be examples that omit one or more of conductive elements 112, 113, or 114, or one or more of dielectric elements 116, 117, or 118, or examples that add further conductive elements or dielectric elements.

Base substrate 110 can comprise or be referred to as a pre-formed substrate, a laminate substrate, a cored substrate, a prepreg substrate, a printed circuit board, a printed wire board, a rigid substrate, a glass epoxy substrate, a molded substrate, a ceramic substrate, or a pre-molded lead frame substrate. Base substrate 110 can comprise substrate side 110a and substrate side 110b opposite each other.

Conductive structure 111 can comprise substrate inward terminals 112 provided on substrate side 110a, substrate outward terminals 113 provided on substrate side 110b, and conductive paths 114 extending between substrate side 11a and substrate side 110b. Substrate paths 114 can couple respective substrate inward terminals 112 and substrate outward terminals 113 with each other.

In some examples, substrate inward terminals 112 can be provided on substrate side 110a in a matrix configuration having rows or columns, or substrate outward terminals 113 can be provided on substrate side 110b in a matrix configuration having rows or columns. Substrate inward terminals 112 or substrate outward terminals 113 can comprise or be referred to as conductors, conductive material, substrate lands, substrate pads, studs, bumps, or under bump metallurgies (UBMs).

Conductive paths 114 provided through dielectric structure 115 can electrically connect substrate inward terminals 112 with substrate outward terminals 113. In some examples, conductive paths 114 can comprise or be referred to as conductors, conductive material, conductive vias, circuit patterns, traces, or wire patterns. In some examples, conductive elements 112, 113, or 114 can comprise copper, iron, nickel, gold, silver, palladium, or tin.

Dielectric structure 115 can comprise dielectric layer 116, which can represent one or more dielectric layers stacked on each other. Dielectric layer 116 can comprise or be referred to as one or more dielectric layers, core layers or, prepreg layers. In some examples, dielectric layer 116 can comprise epoxy resin, phenol resin, glass epoxy, polyimide, polyester, epoxy molding compound, or ceramic. In some examples, dielectric layer 116 can have a thickness in a range from about 10 micrometer (μm) to about 200 μm.

Dielectric structure 115 can comprise dielectric layer 117 at substrate side 111a and dielectric layer 118 at substrate side 111b. Dielectric layer 117 can surround or cover portions of substrate inward terminals 112, and dielectric layer 118 can surround or cover portions of substrate outward terminals 113. In some examples, dielectric layers 117 or 118 can comprise or be referred to as dielectric layer, protective layer, solder mask, or solder resist. In some examples, dielectric layers 117 and 118 can comprise polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric layers 117 or 118 can have a thickness in a range from about 5 μm to about 40 μm. Dielectric layers 117 and 118 can respectively protect substrate inward terminals 112 and substrate outward terminals 113 during manufacturing of electronic devices.

In some examples, base substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier, for example a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier and can be removed after formation of the dielectric and conductive layers and before attachment to the electronic device. The pre-formed substrate can referred to as a printed circuit board (PCB) or a laminate substrate. Such pre-formed substrate can be formed through a semi-additive or modified-semi-additive process. Other substrates in this disclosure can also comprise a pre-formed substrate.

FIG. 2B shows a cross-sectional view of electronic device 100 at a later stage of manufacture. In the example shown in FIG. 2B, vertical interconnects 120 can be coupled with substrate inward terminals 112 of base substrate 110. In some examples, vertical interconnects 120 can be arrayed in a matrix configuration having rows or columns.

In some examples, vertical interconnects 120 can comprise or be referred to as metal-core solder-coated ball, solder ball, post, pillar, or vertical wire. As an example, vertical interconnects 120 can comprise tin (Sn), silver(Ag), lead (Pb), copper (Cu), Sn—Pb, Sn37-Pb, Sn95-Pb, Sn—

Pb—Ag, Sn—Cu, Sn—Ag, Sn—Au, Sn—Bi, or Sn—Ag—Cu. For example, vertical interconnects 120 can be provided using a ball drop process, a screen-printing process, or an electroplating process. In some examples, a vertical interconnect 120 having a metal-core solder-coated ball can comprise a non-solder metal core ball such as copper coated with a solder material, and such metal-core solder-coated ball can be bonded to substrate inward terminals 112 of base substrate 110 using a ball drop process followed by a solder reflow process. In some examples, vertical interconnects 120 can have a height in a range from about 60 µm to about 200 µm.

FIG. 2C shows a cross-sectional view of electronic device 100 at a later stage of manufacture. In the example shown in FIG. 2C, electronic component 130 can be coupled with substrate inward terminals 112 of base substrate 110. In some examples, electronic component 130 can be over a first side of base substrate 110. In some examples, electronic component 130 can be coupled with conductive structure 111 via component terminals 131, and can be bounded at opposite sides by vertical interconnects 120.

In some examples, pick-and-place equipment can pick up electronic component 130 and then place it on substrate inward terminals 112 of base substrate 110. Subsequently, electronic component 130 can be bonded to substrate inward terminals 112 of base substrate 110 using a mass flow process, a thermal compression process, or a laser assist bonding process.

Electronic component 130 can comprise one or more implementation options. In some implementations, electronic component 130 can comprise or be referred to as one or more dies, chips, or packages. In some implementations, electronic component 130 can comprise or can be configured as a passive device, for example a resistor, a capacitor, an inductor, or an antenna. In some implementations, electronic component 130 can comprise or can be configured as an active device, for example comprising transistors. In some implementations, electronic component 130 can comprise a memory, a controller, a digital signal processor (DSP), a microprocessor, a network processor, a power management processor, an audio processor, a radio-frequency (RF) circuit, a wireless baseband system-on-chip (SoC) processor, a sensor, or an application specific integrated circuit (ASIC) device.

Electronic component 130 can comprise component terminals 131 configured to provide electrical interface for electronic component 130. In some examples, component terminals 131 can be arrayed to be spaced apart from one another in row or column directions. Component terminals 131 can be input/output (I/O) terminals of electronic component 130.

In some examples, component terminals 131 can comprise or be referred to as die pads, bond pads, conductive bumps, conductive pillars, or conductive posts. Component terminals 131 can comprise an electrically conductive material such as aluminum, copper, tin, or solder. In some examples, component terminals 131 can comprise a non-solder metallic material capped with a low-melting-point material. Component terminals can comprise a low-melting-point material such as Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu, or equivalents. The overall height of electronic component 130 can be in a range from about 50 µm to about 100 µm. The height of electronic component 130 can be shorter than the height of vertical interconnects 120.

FIG. 2D shows a cross-sectional view of electronic device 100 at a later stage of manufacture. In the example shown in FIG. 2D, underfill 133 can fill a region between base substrate 110 and electronic component 130.

In some examples, underfill 133 can comprise or be referred to as a dielectric layer or a non-conductive paste. In some examples, underfill 133 can be an inorganic filler-free resin. In some examples, underfill 133 can be a capillary underfill (CUF) inserted into gaps between electronic component 130 and base substrate 110 using capillary effect after electronic component 130 is electrically connected to base substrate 110, followed by curing. In some examples, underfill 133 can be a non-conductive paste (NCP) underfill or a non-conductive film (NCF) underfill. In some examples, underfill 133 can be first applied to cover substrate inward terminals 112 of base substrate 110, and then component terminals 131 of electronic component 130 can extend through underfill 133 to couple with inward terminals 112. Underfill 133 can prevent electronic component 130 from being electrically disconnected from base substrate 110 due to physical shock or chemical shock. In some examples, however, underfill 133 can be optional.

FIG. 2E shows a cross-sectional view of electronic device 100 at a later stage of manufacture. In the example shown in FIG. 2E, a singulation process can be carried out to yield multiple subassemblies 102 separated from each other. Each subassembly 102 can include one or more electronic components 130 or one or more vertical interconnects 120 coupled to a base substrate 110. In some examples, the singulation process can be carried out by a diamond wheel, laser beam, or etching.

In some examples, base substrates 110 can be singulated while held together with a lamination tape attached to entirely cover substrate sides 110b. The base substrates 10 of subassemblies 102 can be maintained attached to the single lamination tape for further handling.

FIG. 2F shows a cross-sectional view of electronic device 100 at a later stage of manufacture. In the example shown in FIG. 2F, base substrate 110 of subassembly 102 can be attached to carrier 10, with substrate side 110b facing carrier 10. Although a single subassembly 102 is shown attached to carrier 10, multiple subassemblies 102 can be attached to carrier 10 adjacent to each other in row or column directions.

Carrier 10 can be substantially planar. For example, carrier 10 can comprise or be referred to as a board, a wafer, a panel, or a strip. In some examples, carrier 10 can comprise or be referred to as steel, stainless steel, aluminum, copper, ceramic, glass, or semiconductor. Carrier 10 can have a thickness in a range from about 1 millimeter (mm) to about 1.5 mm, and a width in a range from about 200 mm to about 510 mm.

Carrier 10 can function for integrally handling multiple components in providing encapsulant 140 and interposer substrate 150. Carrier 10 can be commonly applied to different examples of the present disclosure.

Adhesive 105 can be provided to maintain subassembly 102 secured to carrier 10. Adhesive 105 can be applied by coating process such as spin coating or spray coating, by a printing process such as screen printing, pad printing, gravure printing, or inkjet printing, or by direct attachment of an adhesive film or an adhesive tape. Adhesive 105 can comprise or be referred to as a temporary adhesive film or a temporary adhesive tape. Adhesive 105 can comprise, for example, a thermally releasable tape or film or a photo-releasable tape or film where its adhesiveness can be weakened or removed by heat or light. In some examples, the adhesiveness of adhesive 105 can be weakened or removed by physical or chemical external force. Adhesive 105 can be commonly applied to some examples of the present disclosure.

FIG. 2G shows a cross-sectional view of electronic device 100 at a later stage of manufacture. In the example shown in FIG. 2G, encapsulant 140 can be provided on over carrier 10 so as to surround or cover base substrate 110, vertical interconnects 120, and electronic component 130. In some examples, encapsulant 140 can be over, cover, or contact lateral sides or the top side of base substrate 110. In some examples, encapsulant 140 can cover or contact lateral sides or top ends of vertical interconnects 120, or lateral sides or the top side of electronic component 130. Vertical interconnects 120 can be in encapsulant 140 and can be coupled with conductive structure 111 of base substrate 110.

In some examples, encapsulant 140 can comprise or be referred to as mold compound, resin, or filler-reinforced polymer. In some examples, encapsulant 140 can comprise an organic resin, an inorganic filler, a curing agent, or a catalyst. Encapsulant 140 can be formed by a compression molding process, a transfer molding process, a liquid phase encapsulant molding process, a vacuum lamination process, a paste printing process, or a film-assisted molding process. Encapsulant 140 can have a thickness in a range from about 60 µm to about 200 µm. Encapsulant 140 can cover base substrate 110, vertical interconnects 120 and electronic component 130, protecting base substrate 110, vertical interconnects 120 and electronic component 130 from external elements or environmental exposure.

FIG. 2H shows a cross-sectional view of electronic device 100 at a later stage of manufacture. In the example shown in FIG. 2H, top ends 120a of vertical interconnects 120 can be exposed by removing a top portion of encapsulant 140. Encapsulant 140 can be removed by a general grinding or chemical etching process. When the top portion of encapsulant 140 is removed, material from vertical interconnects 120 can also be removed. Side 140a of encapsulant 140 can be coplanar with top ends 120a of vertical interconnects 120. Such height-reduced encapsulant 140 can have a thickness in a range from about 60 µm to about 200 µm. In some examples, a portion of encapsulant 140 can be removed to expose top ends 120a of vertical interconnects 120 prior to providing interposer substrate 150.

FIGS. 2I-2N show the formation of interposer substrate 150 as an RDL substrate. FIG. 2I shows a cross-sectional view of electronic device 100 at a later stage of manufacture. In the example shown in FIG. 2I, dielectric layer 156 of dielectric structure 155 can be provided on side 140a of encapsulant 140 and top ends 120a of vertical interconnects 120. Aperture 156x exposing top ends 120a of vertical interconnects 120 can then be formed.

Dielectric layer 156 can comprise or be referred to as a coreless layer, or a filler-free layer. In some examples, dielectric layer 156 can comprise an electrically insulating material such as a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric layer 156 can be formed by spin coating, spray coating, dip coating, or rod coating. In some examples dielectric layer 156 can have a thickness in a range from about 4 µm to about 20 µm.

FIG. 2J shows a cross-sectional view of electronic device 100 at a later stage of manufacture. In the example shown in FIG. 2J, seed layer 152x can be formed to uniformly cover side 156a of dielectric structure 156, inner walls of aperture 156x, and top ends 120a of vertical interconnects 120. Seed layer 152x can be electrically connected to vertical interconnects 120 exposed through aperture 156x. In some examples, seed layer 152x can comprise or be referred to as a seed layer. In some examples, seed layer 152x can be formed by sputtering, spraying, PVD, CVD, MOCVD, ALD, LPCVD, or PECVD. In some examples, seed layer 152x can comprise titanium (Ti), titanium-tungsten (TiW), or copper (Cu). Seed layer 152x can have a thickness in a range from about 4 µm to about 15 µm.

FIG. 2K shows a cross-sectional view of electronic device 100 at a later stage of manufacture. In the example shown in FIG. 2K, conductors 152 can be formed on seed layer 152x. Conductors 152 can be provided as one or more conductive patterns, and each of the patterns can be electrically connected to seed layer 152x. Conductors 152 can be electrically connected to vertical interconnects 120 through seed layer 152x.

In some examples, conductors 152 can comprise or be referred to as traces, pads, UBMs, vias, redistribution layers (RDLs), wiring patterns, or circuit patterns. In some examples, conductors 152 can comprise copper, gold, silver or nickel. Conductors 152 can be formed by electroplating through seed layer 152x. In some examples, conductors 152 can be formed using a mask pattern so as to cover a portion of seed layer 152x, and then plating conductors 152 to a predetermined thickness using seed layer 152x as a seed, yielding conductive patterns. The mask pattern can be removed after forming conductors 152. Conductors 152 can have a thickness in a range from about 4 µm to about 15 µm.

FIG. 2L shows a cross-sectional view of electronic device 100 at a later stage of manufacture. In the example shown in FIG. 2L, seed layer 152x can be removed. In some examples, seed layer 152x can be removed by etching the portion exposed by conductors 152. As seed layer 152x is removed, side 156a of dielectric layer 156 can be exposed. In some examples, the remaining portion of seed layer 152x can be considered part of conductors 152. The respective patterns of conductors 152 can be coupled to vertical interconnects 120 exposed through aperture 156x of dielectric layer 156. In some examples, regions of conductors 152 coupled to vertical interconnects 120 can comprise or be referred to as interposer inward terminals 152y. In some examples, interposer inward terminals 152y can comprise or be referred to as pads or lands.

FIG. 2M shows a cross-sectional view of electronic device 100 at a later stage of manufacture. In the example shown in FIG. 2M, dielectric layer 157 can be provided on side 156a of dielectric layer 156 and side 152a of conductors 152. Dielectric layer 157 can be provided on side 156a of dielectric layer 156 and side 152a of conductors 152, and aperture 157x exposing side 152a of conductors 152 can be formed. In some examples, dielectric layer 157 can be similarly formed as, or can be made of similar material as, dielectric layer 156.

FIG. 2N shows a cross-sectional view of electronic device 100 at a later stage of manufacture. In the example shown in FIG. 2N, conductors 154 can be provided on conductors 152 exposed through aperture 157x of dielectric layer 157. In some examples, conductors 154 can be referred to as interposer outward terminals 154.

Conductors 154 can be formed by electroplating using seed layer 154x as a seed. In some examples, seed layer 154x or conductors 154 can be similarly formed as, or can be made of similar material as, seed layer 152x or conductors 152, respectively. Conductor cap 159 can be provided on side 154a of conductors 154. In some examples, conductor cap 159 can comprise or be referred to as a pad, a stud, a bump, or a UBM. In some examples, conductor cap 159 can comprise a plated material, a solder material, or a solderable material. For instance, conductor cap 159 can be made of a low melting point material such as Sn, Ag, Pb, Cu, Sn—Pb, Sn37-Pb, Sn95-Pb, Sn—Pb—Ag, Sn—Cu, Sn—Ag, Sn—Au, Sn—Bi, or Sn—Ag—Cu. In some examples, respective portions of seed layer 154x can be considered part of respective conductors 154. Conductors 154 can be electrically connected to vertical interconnects 120 through conductors 152. The thickness of conductors 154 can be in a range from about 2 μm to about 10 μm.

With conductors 154 formed, interposer substrate 150 can be considered completed. Interposer substrate 150 can comprise dielectric structure 155 comprising dielectric layers 156 and 157, and conductive structure 151 comprising conductors 152 and conductors 154.

Conductive structure 151 of interposer substrate 150 can be electrically connected to base substrate 110 through vertical interconnects 120. Although interposer substrate 150 has been described with dielectric structure 155 having two dielectric layers, and with conductive structure 151 having two dielectric layers, different numbers of layers or tiers of layers can be formed for interposer substrate 150. Interposer substrate 150 can comprise or be referred to as a redistribution layer (RDL) substrate, a buildup substrate, or a coreless substrate. Vertical interconnects 120 can be coupled with conductive structure 151 of interposer substrate 150.

Interposer substrate 150 is presented as a redistribution layer ("RDL") substrate in the present example. RDL substrates can comprise one or more conductive redistribution layers and one or more dielectric layers and (a) can be formed layer by layer over an electronic device to where the RDL substrate is to be electrically coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

FIG. 2O shows a cross-sectional view of electronic device 100 at a later stage of manufacture. In the example shown in FIG. 2O, carrier 10 can be removed from substrate side 110b of base substrate 110, and from side 140b of encapsulant 140. Adhesive 105 can be separated from base substrate 110 and encapsulant 140 while still attached to carrier 10. In some examples, heat, light, a chemical solution, or physical external force can be applied to remove or lessen adhesiveness of adhesive 105. Accordingly, substrate side 110b of base substrate 110, and side 140b of encapsulant 140, can be exposed. Substrate outward terminals 113 of base substrate 110 can also be exposed. Interposer substrate 150 can be over the top side of encapsulant 140.

FIG. 2P shows a cross-sectional view of electronic device 100 at a later stage of manufacture. In the example shown in FIG. 2P, electronic component 160 and external interconnects 170 can be coupled to substrate outward terminals 113 of base substrate 110.

Terminals 161 of electronic component 160 can be coupled to substrate outward terminals 113. In some examples, electronic component 160 can comprise one or more of the implementation options described above with respect to electronic component 130.

External interconnects 170 can be coupled to substrate outward terminals 113 of base substrate 110. External interconnects 170 can be coupled to electronic component 130 or electronic component 160 through base substrate 110. External interconnects 170 can be coupled to interposer substrate 150 through base substrate 110 and vertical interconnects 120.

In some examples, external interconnects 170 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 170 can be formed using a ball drop process, a screen printing process or an electroplating process. For example, external interconnects 170 can be formed by providing a conductive material containing a solder to the sides of substrate outward terminals 113 of base substrate 110 using a ball drop process followed by performing a reflow process. External interconnects 170 can comprise or be referred to as conductive balls such as solder balls, conductive pillars such as copper pillars, or conductive posts having solder caps on copper pillars. External interconnects 170 can have a size in a range from about 50 µm to about 250 µm.

FIG. 2Q shows a cross-sectional view of electronic device 100 at a later stage of manufacture. In the example shown in FIG. 2Q, interposer substrate 150 and encapsulant 140 can be singulated for separation into individual electronic devices 100. In some examples, the singulation can also cut through base substrate 110. Lateral sides of base substrate 110 can be exposed from encapsulant 140 at lateral sides of electronic device 100. Lateral sides of base substrate 110, of encapsulant 140, or of interposer substrate 150 can be substantially coplanar after singulation. In some examples, encapsulant 140 can contact a top side of electronic component 130 between electronic component 130 and interposer substrate 150.

In some examples, some regions of interposer substrate 150 and encapsulant 140 can be removed or cut through by a diamond wheel, a laser beam, or an etching process. Completed electronic devices 100 each can comprise base substrate 110, vertical interconnects 120, one or more electronic components 130, encapsulant 140, interposer substrate 150, one or more electronic components 160, or external interconnects 170. In some examples, external interconnects 170 or conductors 154 of interposer substrate 150 can be referred to as external input/output terminals of electronic device 100. In some examples, a conductive element 152 of conductive structure 151 of interposer substrate 150 can comprise a metal trace having a via extending from the metal trace toward base substrate 110. Such a via as shown in FIG. 2Q can be referred to as a downward via. Such a metal trace and downward via can be integral with each other and can be part of a same conductive layer. In FIG. 2Q, interposer substrate 150 can comprise an RDL substrate and base substrate 110 can comprise a laminate substrate.

Figure 3:
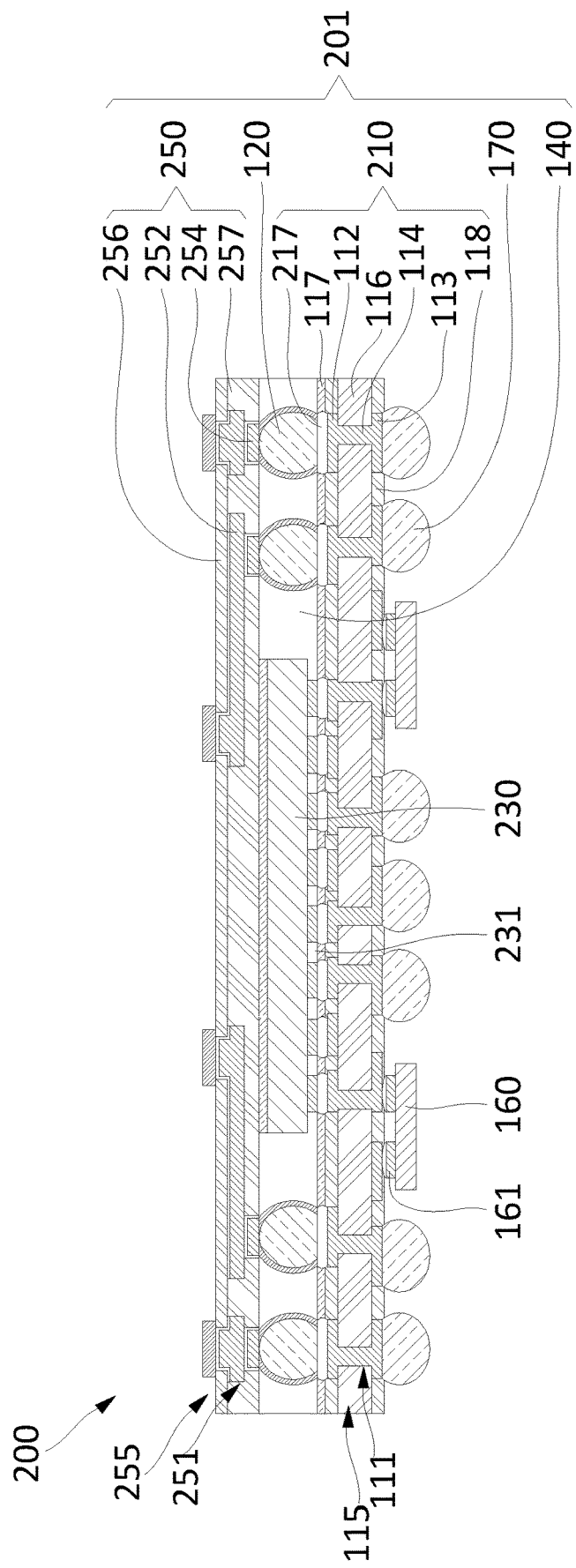
FIG. 3 shows a cross-sectional view of an example electronic device.

FIG. 3 shows a cross-sectional view of an example electronic device 200. In the example shown in FIG. 3, electronic device 200 can comprise base substrate 210, vertical interconnects 120, electronic component 230, encapsulant 140, interposer substrate 250, electronic component 160 and external interconnects 170. Electronic device 200 can be similar to other electronic devices in this disclosure, such as electronic device 100 shown in FIG. 1, and can comprise variations in its elements when compared to corresponding elements of such other electronic devices as will be described.

Base substrate 210 can comprise conductive structure 111 and dielectric structure 115.
  Conductive structure 111 can comprise several elements such as conductive elements 112, 113, 114, or 259.
  Dielectric structure 115 can comprise several elements such as dielectric elements 116, 117, or 118.
  Electronic component 230 can comprise component terminals 231.
  Interposer substrate 250 can comprise conductive structure 251 and dielectric structure 255.
  Conductive structure 251 can comprise several elements such as conductive elements 252 or 254.
  Dielectric structure 255 can comprise several elements such as dielectric elements 256 or 257.

Base substrate 210, vertical interconnects 120, encapsulant 140, interposer substrate 250 and external interconnects 170 can comprise or be referred to as electronic package 201 or package 201. Electronic package 201 can be similar to electronic package 101.

Figure 4C:
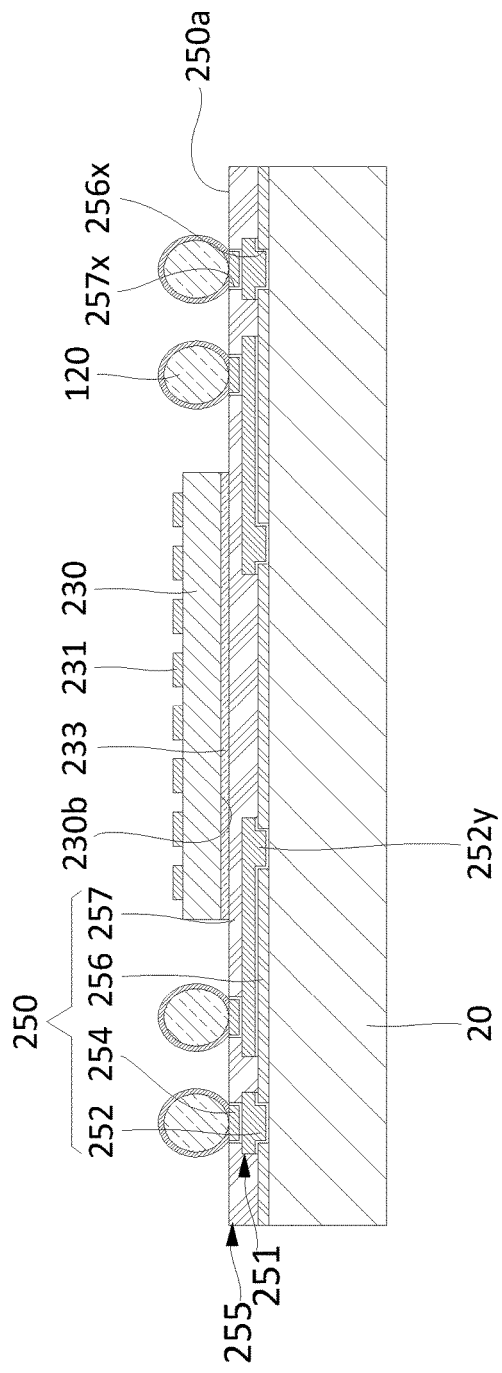

FIGS. 4A to 4J show cross-sectional views of an example method for manufacturing an example electronic device 200. FIG. 4A shows a cross-sectional view of electronic device 200 at an early stage of manufacture. In the example shown in FIG. 4A, interposer substrate 250 can be provided on side 20a of carrier 20 as an RDL substrate. Interposer substrate 250 can comprise dielectric structure 255 and conductive structure 251. There also can be examples that omit one or more of conductive elements 252 or 254, or one or more of dielectric elements 256 or 257, or examples that add further conductive elements or dielectric elements. Interposer substrate 250 can comprise or be referred to as an RDL substrate, a buildup substrate, or a coreless substrate. Interposer substrate 250 can be formed by sequentially forming dielectric layer 256, conductors 252, dielectric layer 257, and conductors 252 on carrier 20.

Dielectric layer 256 can be provided to cover side 20a of carrier 20, and aperture 256x exposing side 20a of carrier 20 can be formed. Dielectric layer 256 can be similarly configured or formed, or can comprise similar material, as described for dielectric layer 156.

Conductors 252 can be provided coupled to side 20a of carrier 20 exposed through apertures 256x of dielectric layer 256. Conductors 252 can define conductive patterns, terminals, pads, or traces, and can contact carrier 20 exposed through apertures 256x. Conductors 252 located on regions contacting carrier 20 can be referred to as interposer outward terminals 252y. In some examples, interposer outward terminals 252y can comprise or be referred to as pads, lands, UBMs or studs. Conductors 252 can be similarly configured or formed, or can comprise similar material, as described for conductors 152.

Dielectric layer 257 can be provided to cover dielectric layer 256 and conductors 252, and apertures 257x exposing the side of conductors 252 can be formed. Dielectric layer 257 can be similarly configured or formed, or can comprise similar material, as described for dielectric layer 157.

Conductors 254 can be provided coupled to conductors 252 exposed through apertures 257x of dielectric layer 257. Conductors 254 can define conductive patterns, terminals, pads, or traces, and can contact conductors 252 exposed through aperture 257x. Portions of conductors 254 exposed from dielectric structure 255 can be referred to as interposer inward terminals. Conductors 254 can be similarly configured or formed, or can comprise similar material, as described for conductors 154. Carrier 20 can be similar to carrier 10.

FIG. 4B shows a cross-sectional view of electronic device 200 at a later stage of manufacture. In the example shown in FIG. 4B, vertical interconnects 120 can be provided on conductors 254 exposed through dielectric structure 255 of interposer substrate 250. Vertical interconnects 120 can be coupled to interposer inward terminals 254 of interposer substrate 250. Vertical interconnects 120 can be similarly provided or coupled as described with respect to FIG. 2B.

FIG. 4C shows a cross-sectional view of electronic device 200 at a later stage of manufacture. In the example shown in FIG. 4C, side 230b of electronic component 230 can be attached to side 250a of interposer substrate 250. In some examples, adhesive 233 can be applied to side 250a of interposer substrate 250, or to side 230b of electronic component 230, and pick-and-place equipment can pick up electronic component 230 and place it on interposer substrate 250 such that electronic component 230 is secured by adhesive 233. In some examples, interposer substrate 250 can comprise an RDL substrate formed on carrier 20, and electronic component 230 can be coupled with the RDL substrate prior to removing carrier 20. Electronic component 230 can be similar to electronic component 130.

Electronic component 230 can comprise component terminals 231 configured to provide electrical interface for electronic component 230. In some examples, component terminals 231 can be arrayed such as to be spaced apart from one another in row or column directions. Component terminals 231 can be input/output (I/O) terminals of electronic component 230. Component terminals 231 can be similar to component terminals 131.

Adhesive 233 can be applied by coating process such as spin coating or spray coating, by a printing process such as screen printing, pad printing, gravure printing, or inkjet printing, or by direct attachment of an adhesive film or an adhesive tape. In some examples, component adhesive 233 can comprise or be referred to an adhesive layer or an adhesive film.

Figure 4D:
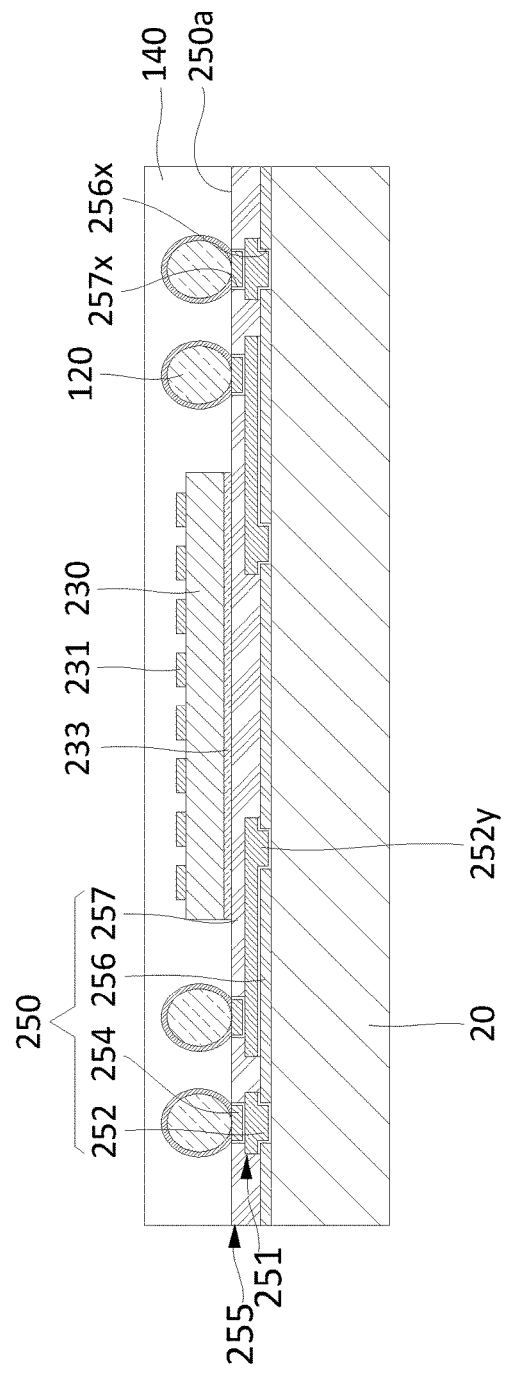

FIG. 4D shows a cross-sectional view of electronic device 200 at a later stage of manufacture. In the example shown in FIG. 4D, encapsulant 140 can be provided to surround or cover vertical interconnects 120, electronic component 230, or interposer substrate 250. In some examples, encapsulant 140 can contact upper ends or lateral sides of vertical interconnects 120, or an upper side or lateral sides of electronic component 230. In some examples, encapsulant 140 can contact a lateral side of interposer substrate 250. Encapsulant 140 can be similarly provided or applied as described with respect to FIG. 2G.

Figure 4E:
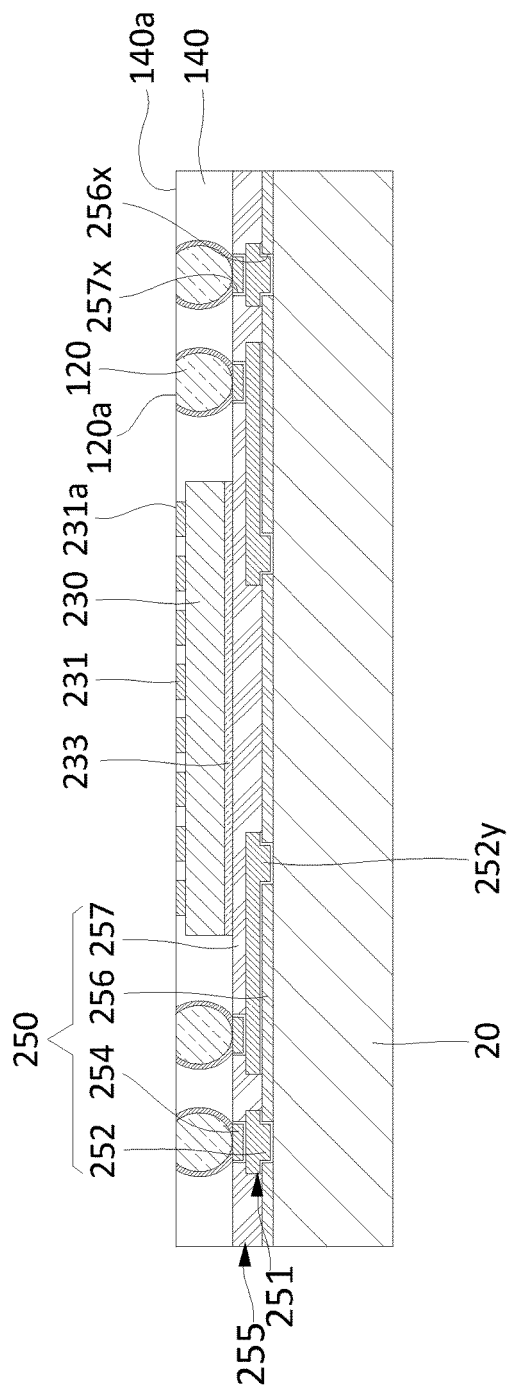

FIG. 4E shows a cross-sectional view of electronic device 200 at a later stage of manufacture. In the example shown in FIG. 4E, portions of vertical interconnects 120 and of component terminals 231 of electronic component 230 can be exposed by removing a portion of encapsulant 140. Encapsulant 140 can be removed by a general grinding or chemical etching process. When the portion of encapsulant 140 is removed, the portions of vertical interconnects 120 or of component terminals 231 can also be removed. Side 140*a* of encapsulant 140 can be coplanar with ends 120*a* of vertical interconnects 120 and with ends 231*a* of component terminals 231 of electronic component 230. Such height-reduced encapsulant 140 can have a thickness in a range from about 60 μm to about 200 μm. In some examples, a portion of encapsulant 140 can be removed to expose a component terminal 231 of electronic component 230 prior to providing base substrate 210.

Figure 4F:
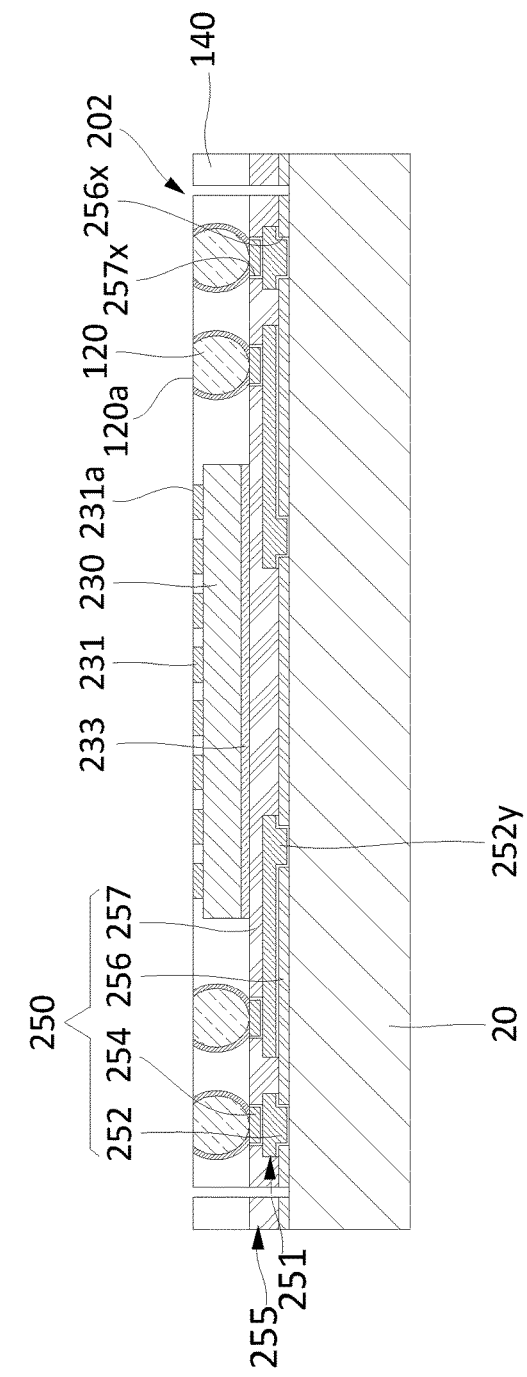

FIG. 4F shows a cross-sectional view of electronic device 200 at a later stage of manufacture. In the example shown in FIG. 4F, a singulation process can be carried out to yield multiple subassemblies 202 separated from each other. Each subassembly 202 can include one or more electronic components 230 or one or more vertical interconnects 120 coupled to an interposer substrate 250. In some examples, the singulation process can be carried out by a diamond wheel, laser beam, or etching. In some examples, interposer substrates 250 can be singulated while still on carrier 20, or after being removed from carrier 20 and transferred to a lamination tape.

FIG. 4G shows a cross-sectional view of electronic device 200 at a later stage of manufacture. In the example shown in FIG. 4G, base substrate 210 can be provided as a pre-formed substrate, and subassembly 202 can be mounted on base substrate 210. Although only one subassembly 202 mounted on base substrate 210 is illustrated, multiple subassemblies 202 can be arrayed and mounted so as to be spaced apart from one another in row or column directions.

Subassembly 202 can be attached to the base substrate 210 after separation of carrier 20 and after singulation. Subassembly 202 can be flipped over such that component terminals 231 of electronic component 230, and vertical interconnects 120 can be exposed to face base substrate 210. Component terminals 231 of electronic component 230 and vertical interconnects 120 can be bonded to base substrate 210.

Base substrate 210 can be similar to base substrate 110 described for FIGS. 1-2, and can comprises similar elements. Base substrate 210 comprises conductor caps 259 on substrate inward terminals 112. Conductor caps 259 can be similarly configured or formed, or can comprise similar material, as described for conductor caps 159. Conductor caps 259 can be considered part of conductive structure 111 of base substrate 210, such as part of substrate inward terminals 112.

Conductor caps 259 can also be provided on exposed portions of conductors 252 of interposer substrate 250. Conductor caps 259 can be similarly configured or formed, or can comprise similar material, as described for conductor caps 159. Conductor caps 259 can be considered part of conductive structure 251 of interposer substrate 250, such as part of interposer outward terminals 252*y*.

FIG. 4H shows a cross-sectional view of electronic device 200 at a later stage of manufacture. In the example shown in FIG. 4H, underfill 203 can fill a region between base substrate 210 and subassembly 202. Underfill 203 can be similar to underfill 133. Underfill 203 can be optional in some examples. In some examples, underfill 203 can be between electronic component 230 and base substrate 210, and between encapsulant 140 and base substrate 210.

Figure 4I:
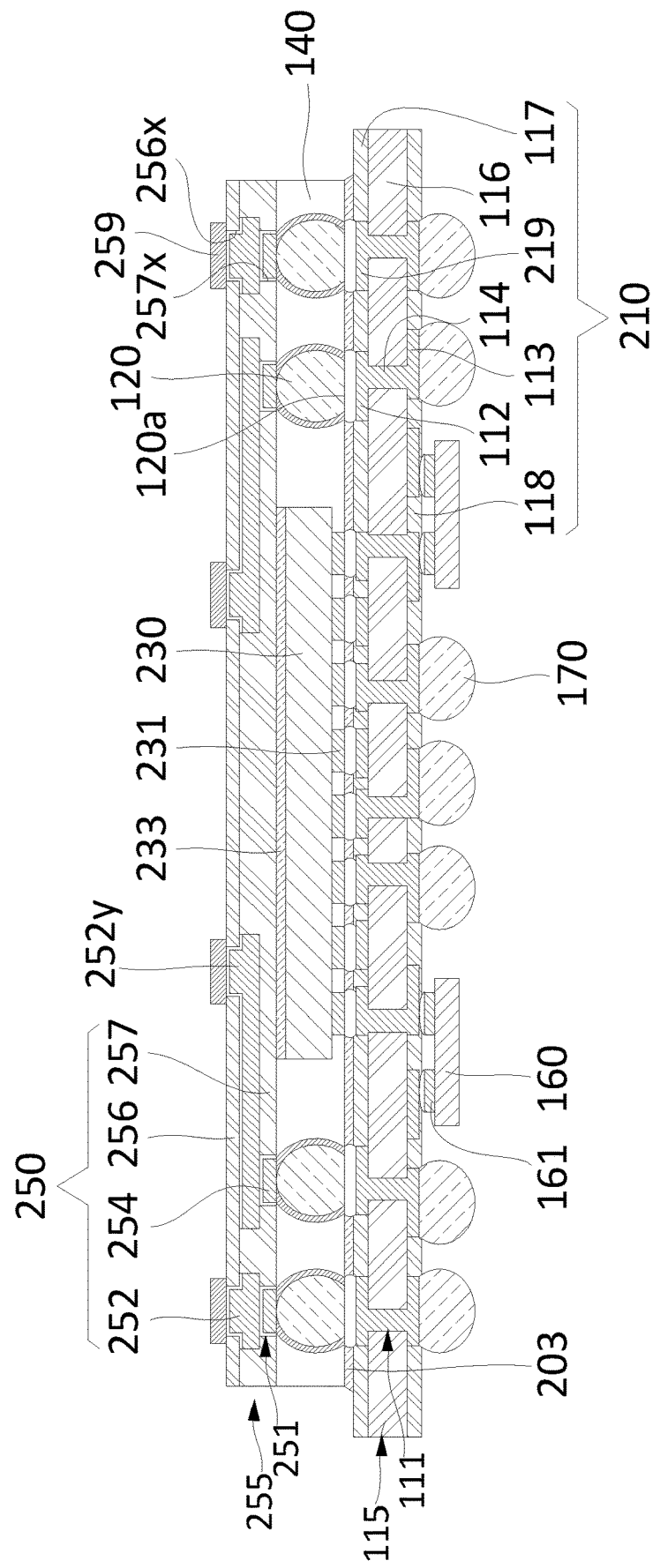

FIG. 4I shows a cross-sectional view of electronic device 200 at a later stage of manufacture. In the example shown in FIG. 4I, electronic component 160 and external interconnects 170 can be coupled with substrate outward terminals 113 of base substrate 210 similarly as described with respect to FIG. 2P. Electronic component 160 can be coupled with the bottom side of base substrate 210 opposite to the top side of base substrate 210 to which electronic component 230 is coupled. Electronic component 160 can be coupled with conductive structure 111 of base substrate 210 via component terminal 161.

Figure 4J:
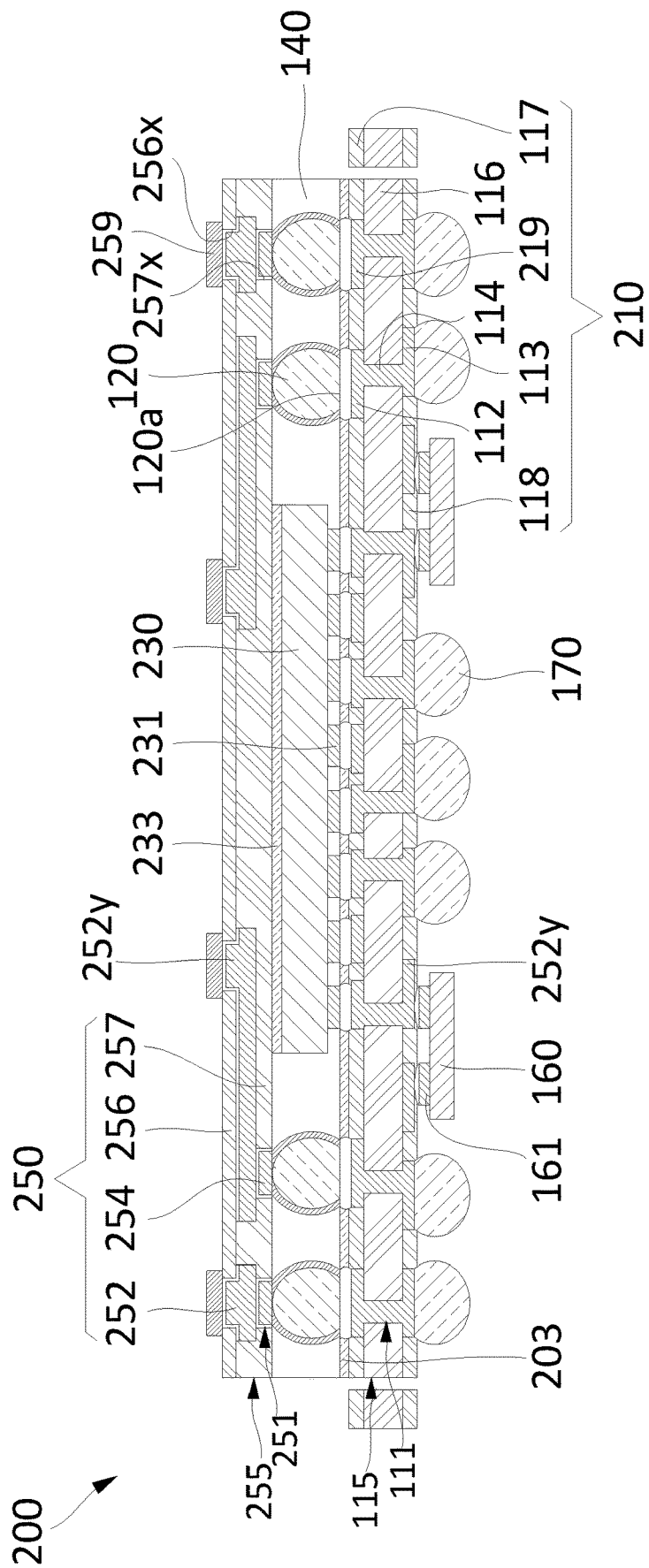

FIG. 4J shows a cross-sectional view of electronic device 200 at a later stage of manufacture. In the example shown in FIG. 4J, base substrate 210 can be singulated for separation into individual electronic devices 200. In some examples, the singulation can also cut through interposer substrate 250 or encapsulant 140. Lateral sides of base substrate 210, of encapsulant 140, or of interposer substrate 250 can be substantially coplanar after singulation.

In some examples, some regions of base substrate 210 can be removed by a diamond wheel, laser beam, or an etching process. Completed electronic devices 200 each can comprise base substrate 210, vertical interconnects 120, one or more electronic components 230, encapsulant 140, interposer substrate 250, one or more electronic components 160, or external interconnects 170. In some examples, external interconnects 170 or interposer outward terminals 252*y* of interposer substrate 250 can be referred to as external input/out (I/O) terminals of electronic device 200. In some examples, conductive element 252 of conductive structure 251 of interposer substrate 250 can comprise a metal trace having a via extending from the metal trace away from base substrate 210. Such a via as shown in FIG. 4J can be referred to as an upward via. Such a metal trace and upward via can be integral with each other and can be part of a same conductive layer. In FIG. 4J, interposer substrate 250 can comprise an RDL substrate and base substrate 210 can comprise a laminate substrate. In some examples, adhesive 233 can contact a top side of electronic component 230 between electronic component 230 and interposer substrate 250.

Figure 5:
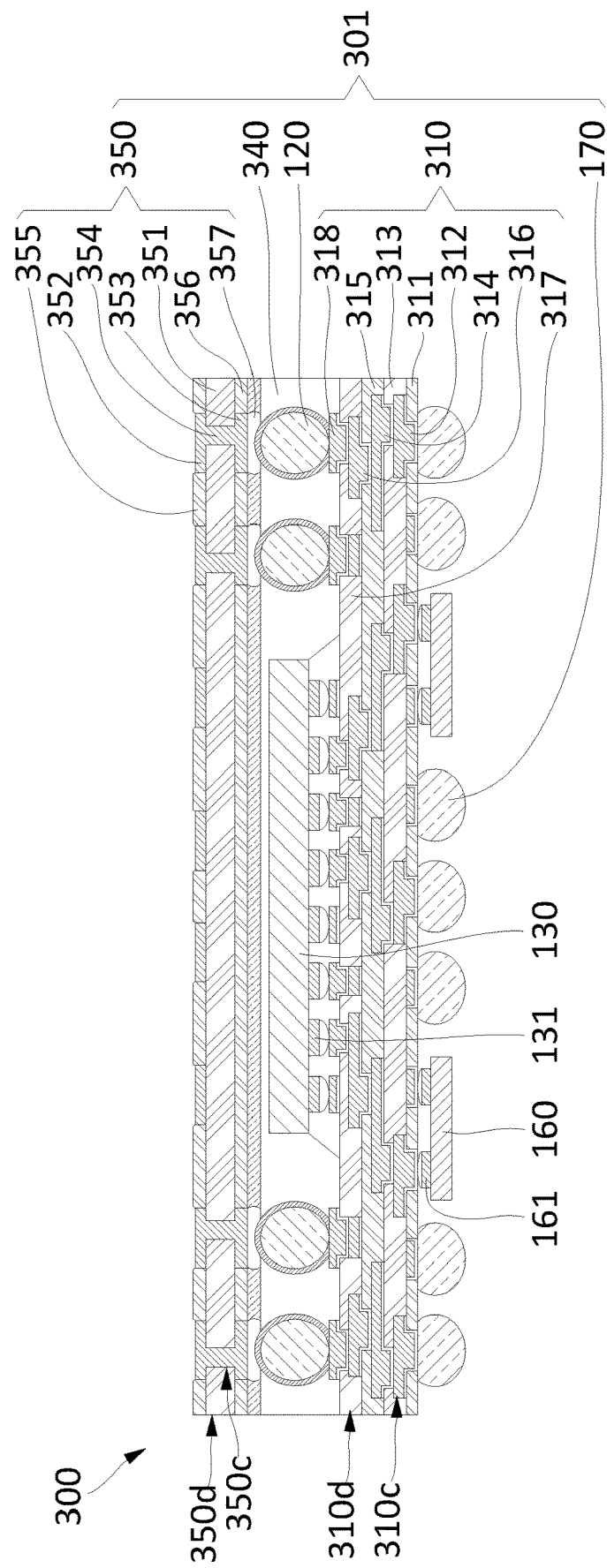
FIG. 5 shows a cross-sectional view of an example electronic device.

FIG. 5 shows a cross-sectional view of an example electronic device 300. In the example shown in FIG. 5, electronic device 300 can comprise base substrate 310, vertical interconnects 120, electronic component 130, encapsulant 340, interposer substrate 350, electronic component 160, and external interconnects 170.

Electronic device 200 can be similar to other electronic devices in this disclosure, such as electronic device 100 shown in FIGS. 1-2 or electronic device 200 shown in FIGS. 3-4, and can comprise variations in its elements when compared to corresponding elements of such other electronic devices as will be described.

Base substrate 310 can comprise conductive structure 310c and dielectric structure 310d. Conductive structure 310c can comprise several elements such as conductive elements 312, 314, 316, or 318. Dielectric structure 310d can comprise several elements such as dielectric elements 311, 313, 315, or 317.

Interposer substrate 350 can comprise conductive structure 350c and dielectric structure 350d. Conductive structure 350c can comprise several elements such as conductive elements 352, 353, 354, or 357. Dielectric structure 350d can comprise several elements such as dielectric elements 351, 355, or 356.

Base substrate 310, vertical interconnects 120, encapsulant 340, interposer substrate 350 and external interconnects 170 can comprise or be referred to as electronic package 301 or package 301. Electronic package 301 can be similar to electronic package 101 or 201.

Figure 6A:
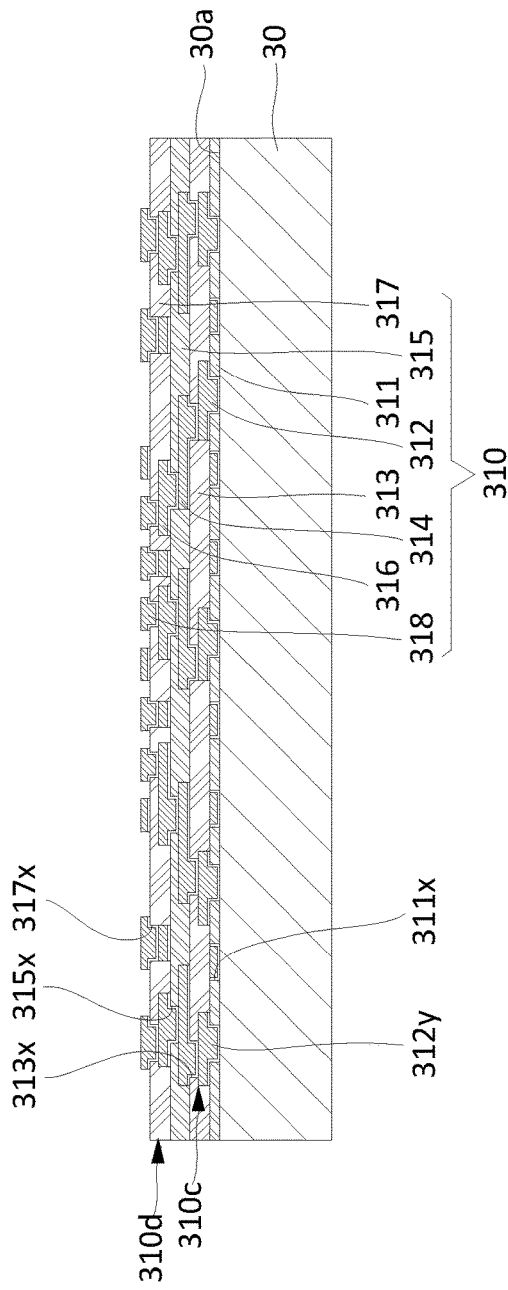

FIGS. 6A to 6I show cross-sectional views of an example method for manufacturing an example electronic device 300. FIG. 6A shows a cross-sectional view of electronic device 300 at an early stage of manufacture. In the example shown in FIG. 6A, base substrate 310 can be formed on carrier 30 as an RDL substrate.

Base substrate 310 can be formed by sequentially providing dielectric layer 311, conductors 312, dielectric layer 313, conductors 314, dielectric layer 315, conductors 316, dielectric layer 317, and conductors 318 on side 30a of carrier 30.

Dielectric layer 311 can be formed on side 30a of carrier 30, and apertures 311x exposing side 30a of carrier 30 can be formed. Dielectric layer 311 can be similarly configured or formed, or can comprise similar material, as described for dielectric layer 156.

Conductors 312 can be formed extending through apertures 311x in contact with carrier 30, and extending laterally on dielectric layer 311. Conductors 312 can comprise or be referred to as traces, pads, UBMs, vias, redistribution layers (RDLs), wiring patterns, or circuit patterns. Portions of conductors 312 formed in contact with carrier 30 can be referred to as substrate outward terminals 312y. In some examples, substrate outward terminals 312y can comprise or be referred to as pads, lands, UBMs, or studs. Conductors 312 can be similarly configured or formed, or can comprise similar material, as described for conductors 152.

Dielectric layer 313 can be formed on dielectric layer 311 and on conductors 312. Apertures 313x can be formed through dielectric layer 313 to expose portions of conductors 312. Dielectric layer 313 can be similarly configured or formed, or can comprise similar material, as described for dielectric layer 156.

Conductors 314 can be formed extending through apertures 313x in contact with conductors 312, and extending laterally on dielectric layer 313. Conductors 314 can comprise or be referred to as traces, pads, UBMs, vias, redistribution layers (RDLs), wiring patterns, or circuit patterns. Conductors 312 can be similarly configured or formed, or can comprise similar material, as described for conductors 152.

Dielectric layer 315 can be formed on dielectric layer 313 and on conductors 314. Apertures 315x can be formed through dielectric layer 315 to expose portions of conductors 314. Dielectric layer 315 can be similarly configured or formed, or can comprise similar material, as described for dielectric layer 156.

Conductors 316 can be formed extending through apertures 315x in contact with conductors 314, and extending laterally on dielectric layer 315. Conductors 316 can comprise or be referred to as traces, pads, UBMs, vias, redistribution layers (RDLs), wiring patterns, or circuit patterns. Conductors 316 can be similarly configured or formed, or can comprise similar material, as described for conductors 152.

Dielectric layer 317 can be formed on dielectric layer 315 and on conductors 316. Apertures 317x can be formed through dielectric layer 317 to expose portions of conductors 316. Dielectric layer 317 can be similarly configured or formed, or can comprise similar material, as described for dielectric layer 156.

Conductors 318 can be formed extending through apertures 317x in contact with conductors 316. In some examples, conductors 318 can also be formed extending laterally on dielectric layer 317. Conductors 318 can comprise or be referred to as traces, pads, UBMs, vias, redistribution layers (RDLs), wiring patterns, or circuit patterns. Conductors 318 can be similarly configured or formed, or can comprise similar material, as described for conductors 152. Conductors 318 can be referred to as substrate inward terminals 318.

Although base substrate 310 has been described as having a specific number of dielectric layers and conductive layers, more or less than such number of layers can be used to form base substrate 310. Base substrate 310 can comprise or be referred to as RDL substrate, a buildup substrate, or a coreless substrate. Base substrate 310 can be similar to interposer substrate 150. Carrier 30 can be similar to carrier 10.

Figure 6B:
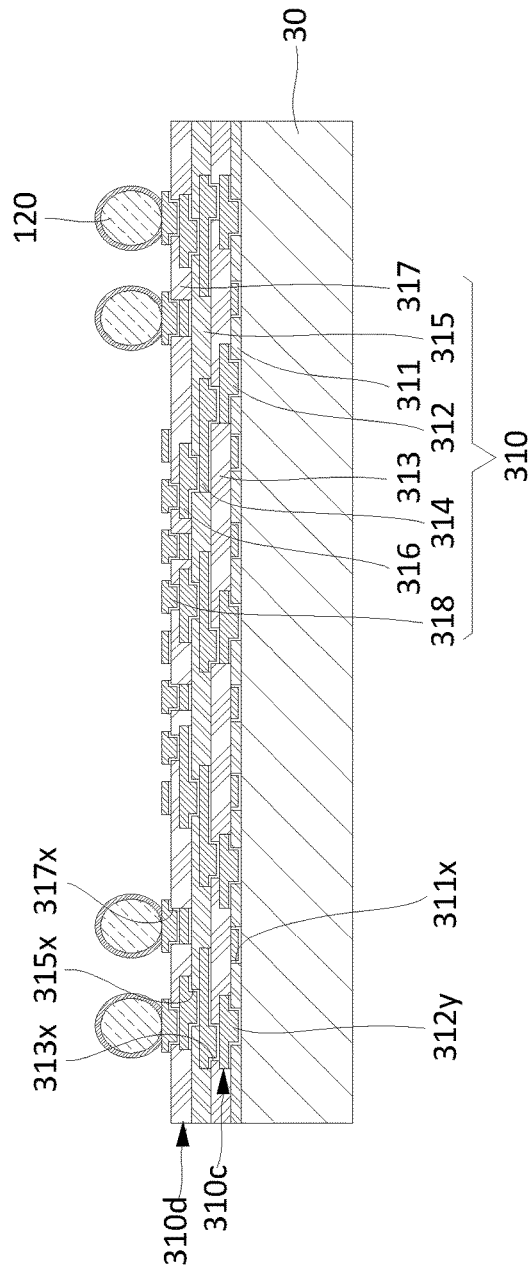

FIG. 6B shows a cross-sectional view of electronic device 300 at a later stage of manufacture. In the example shown in FIG. 6B, vertical interconnects 120 can be coupled with substrate inward terminals 318 of base substrate 310. Vertical interconnects 120 can be similarly provided or coupled as described with respect to FIG. 2B.

Figure 6C:
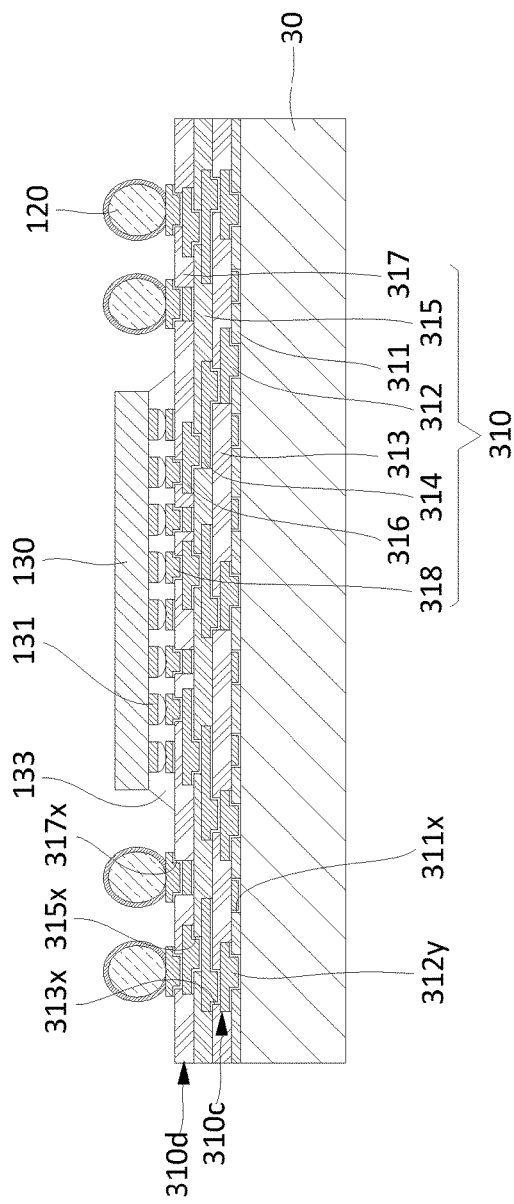

FIG. 6C shows a cross-sectional view of electronic device 300 at a later stage of manufacture. In the example shown in FIG. 6C, electronic component 130 can be coupled with substrate inward terminals 318 of base substrate 310. Electronic component 130 can comprise component terminals 131, coupled to substrate inward terminals 318. Underfill 133 can fill a region between electronic component 130 and base substrate 310.

Figure 6D:
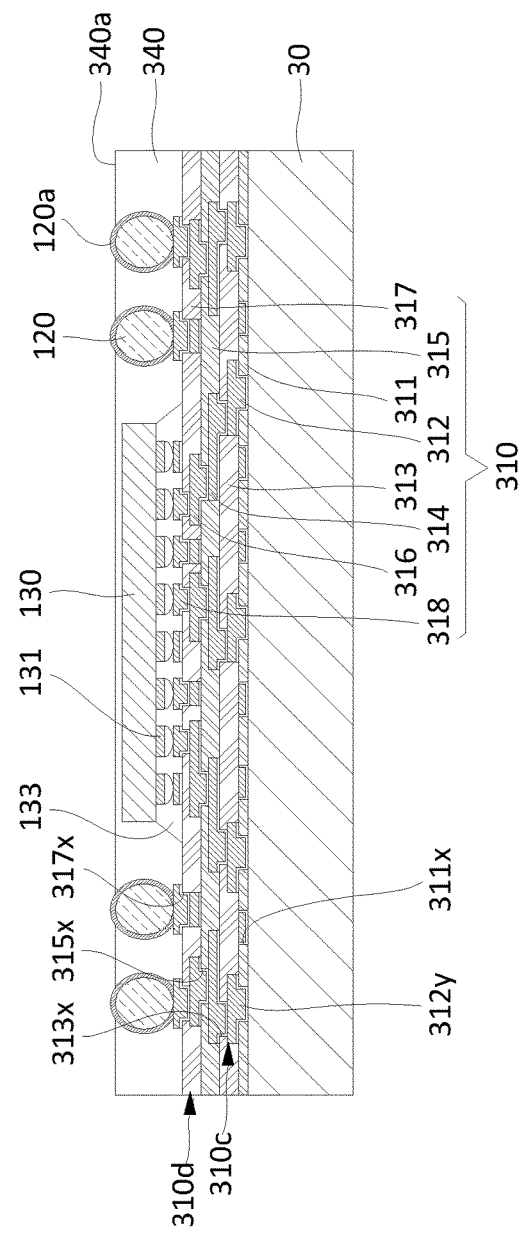

FIG. 6D shows a cross-sectional view of electronic device 300 at a later stage of manufacture. In the example shown in FIG. 6D, encapsulant 340 can be provided to surround or cover vertical interconnects 120, electronic component 130, or base substrate 310. Encapsulant 340 comprise similar material to encapsulant 140.

Encapsulant 340 can be applied on base substrate 310, covering lateral sides of vertical interconnects 120 and lateral sides of electronic component 130. In the present example, top ends 120a of vertical interconnects 120 can be exposed through side 340a of encapsulant 340. Top ends 120a of vertical interconnects 120 can protrude upwardly past side 340a of encapsulant 340. In some examples, encapsulant 340 can be formed by a film-assist molding process that shields top ends 120a of vertical interconnects 120 during encapsulation such that they remain uncovered by encapsulant 340. In some examples, encapsulant 340 can be formed by a compression molding process, a transfer molding process, a liquid phase encapsulant molding process, or a lamination process. A thickness of encapsulant 340 can be smaller than a height of each of vertical interconnects 120. In some examples, the top side of electronic component 130 also can be exposed from encapsulant 340. In some examples encapsulant 340 can have a thickness in a range from about 60 μm to about 200 μm.

Figure 6E:
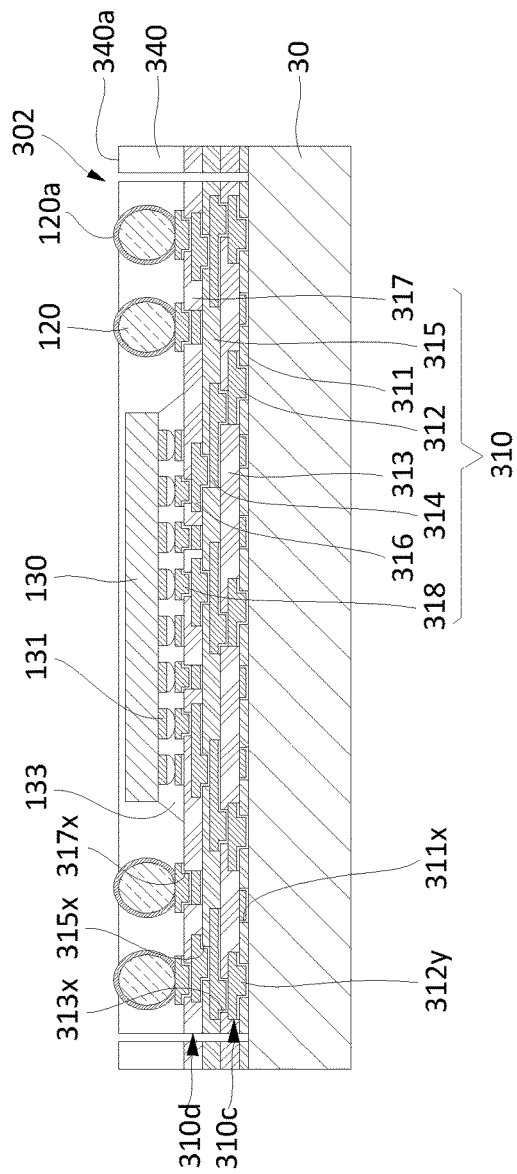

FIG. 6E shows a cross-sectional view of electronic device 300 at a later stage of manufacture. In the example shown in FIG. 6E, a singulation process can be carried out to yield multiple subassemblies 302. Each subassembly 302 can include one or more electronic components 130 or one or more vertical interconnects 120 coupled to a base substrate 310. In some examples, the singulation process can be carried out by a diamond wheel, laser beam, or etching.

Figure 6F:
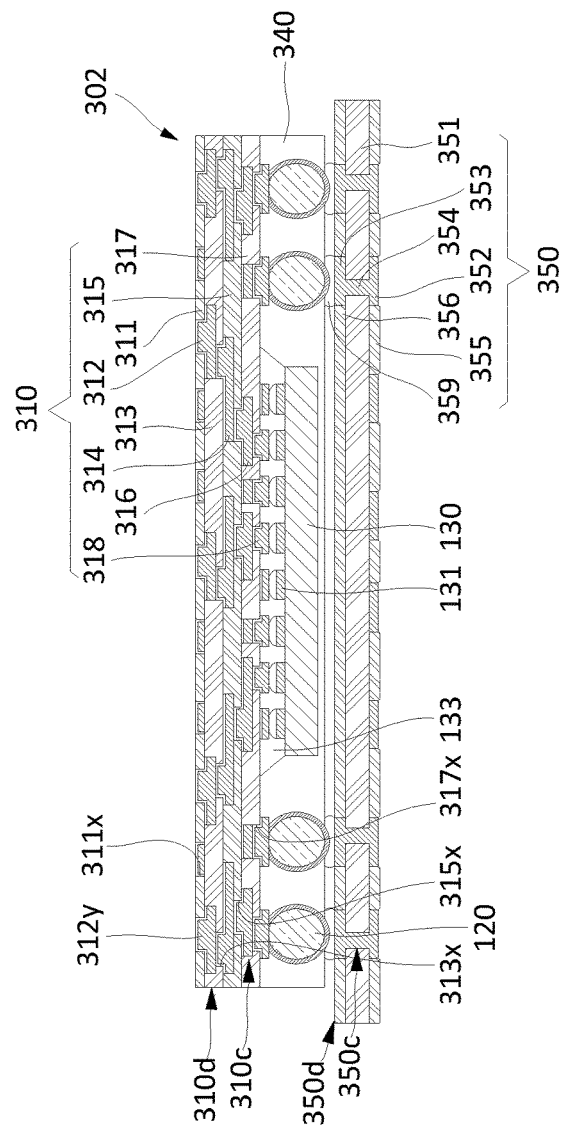

FIG. 6F shows a cross-sectional view of electronic device 300 at a later stage of manufacture. In the example shown in FIG. 6F, interposer substrate 350 can be provided as a pre-formed substrate, and subassembly 302 can be mounted on interposer substrate 350. Although only one subassembly 302 mounted on interposer substrate 350 is illustrated, multiple subassemblies 302 can be arrayed and mounted so as to be spaced apart from one another in row or column directions.

Subassembly 302 can be attached to interposer substrate 350 after separation of carrier 30 and after singulation. Subassembly 302 can be flipped over such that vertical interconnects 120 can be exposed to face interposer substrate 350. Vertical interconnects 120 can be bonded to substrate inward terminals 353 of interposer substrate 350.

Interposer substrate 350 can be similar to base substrate 110 described for FIGS. 1-2, and can comprise similar elements. Interposer substrate 350 can comprise conductive structure 350c and dielectric structure 350d. Conductive structure 350c can comprise substrate outward terminals 352, conductive paths 354, substrate inward terminals 353, or conductor caps 359, and can be respectively similar to substrate outward terminals 113, conductive paths 114, substrate inward terminals 112, and conductor caps 259. In some examples, conductor caps 359 can be considered part of substrate inward terminals 353. Dielectric structure 350d can comprise dielectric layers 351, 355, or 356, and can be respectively similar to dielectric layers 116, 117, or 118. In some examples, interposer substrate 250 can comprise a different number of conductive layers or dielectric layers.

FIG. 6G shows a cross-sectional view of electronic device 300 at a later stage of manufacture. In the example shown in FIG. 6G, underfill 303 can fill a region between interposer substrate 350 and subassembly 302. Underfill 303 can be similar to underfills 133 or 203. In some examples, underfill 303 can be between electronic component 130 and interposer substrate 350, and between encapsulant 340 and interposer substrate 350.

FIG. 6H shows a cross-sectional view of electronic device 300 at a later stage of manufacture. In the example shown in FIG. 6H, electronic component 160 or external interconnects 170 can be coupled with substrate outward terminals 312y of base substrate 310.

Electronic component 160 can be coupled to substrate outward terminals 312y through component terminals 161. External interconnects 170 can be coupled to electronic component 130 or electronic component 160 through base substrate 310. External interconnects 170 can be coupled to interposer substrate 350 through base substrate 310 and vertical interconnects 120.

Figure 6I:
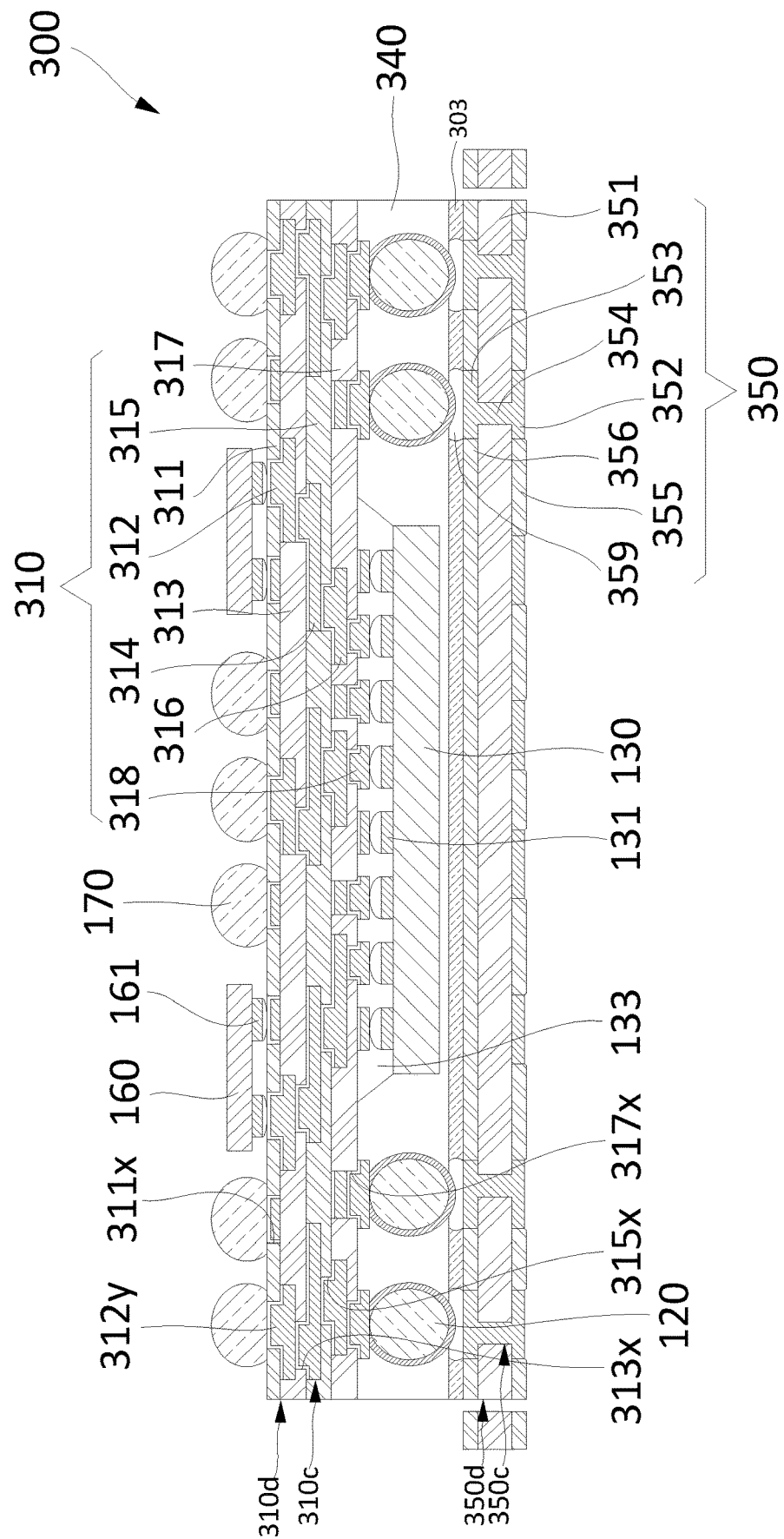

FIG. 6I shows a cross-sectional view of electronic device 300 at a later stage of manufacture. In the example shown in FIG. 6I, interposer substrate 350 can be singulated for separation into individual electronic devices 300. In some examples, the singulation can also cut through base substrate 310 or encapsulant 340. Lateral sides of base substrate 310, of encapsulant 340, or of interposer substrate 350 can be substantially coplanar after singulation.

In some examples, some regions of base substrate 310 can be removed by a diamond wheel, laser beam, or an etching process. Completed electronic device 300 can comprise base substrate 310, vertical interconnects 120, one or more electronic components 130, encapsulant 340, interposer substrate 350, one or more electronic components 160, and external interconnects 170. Completed electronic device 300 can be flipped over as shown in FIG. 5 such that external interconnects 170 face downward. In some examples, external interconnects 170 or substrate outward terminals 352 of interposer substrate 350 can be referred to as external input/output (I/O) terminals of electronic device 300. In FIG. 6I, interposer substrate 350 can comprise a laminate substrate and base substrate 310 can comprise an RDL substrate.

The present disclosure includes reference to certain examples. It will be understood by those skilled in the art, however, that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
   a base substrate comprising a base substrate conductive structure;
   a first electronic component over a first side of the base substrate;
   an encapsulant over the first side of the base substrate, wherein the encapsulant contacts a lateral side of the first electronic component;
   an interposer substrate over a first side of the encapsulant and comprising an interposer substrate conductive structure; and
   a vertical interconnect in the encapsulant and coupled with the base substrate conductive structure and the interposer substrate conductive structure;
   wherein:
   a first one of the base substrate or the interposer substrate comprises a redistribution layer (RDL) substrate comprising a coreless substrate; and
   a second one of the base substate or the interposer substrate comprises a laminate substrate comprising a printed circuit board.

2. The electronic device of claim 1, further comprising an underfill between the first electronic component and the base substrate, and between the encapsulant and the base substrate, wherein the base substrate comprises prepreg.

3. The electronic device of claim 1, wherein the encapsulant contacts a top side of the first electronic component between the first electronic component and the interposer substrate.

4. The electronic device of claim 1, further comprising an adhesive contacting a top side of the first electronic component between the first electronic component and the interposer substrate.

5. The electronic device of claim 1, wherein the interposer substrate comprises the redistribution layer (RDL) substrate.

6. The electronic device of claim 5, wherein the base substrate comprises the laminate substrate.

7. The electronic device of claim 1, wherein the base substrate comprises the redistribution layer (RDL) substrate.

8. The electronic device of claim 7, wherein the interposer substrate comprises the laminate substrate.

9. The electronic device of claim 1, further comprising a second electronic component coupled with a second side of the base substrate opposite to the first side of the base substrate, and coupled with the base substrate conductive structure.

10. The electronic device of claim 1, further comprising an underfill between the first electronic component and the interposer substrate, and between the encapsulant and the interposer substrate.

11. The electronic device of claim 1, wherein the interposer substrate conductive structure comprises a metal trace comprising an upward via extending from the metal trace away from the base substrate.

12. The electronic device of claim 1, wherein the vertical interconnect comprises a metal-core solder-coated ball.

13. A method to manufacture an electronic device, comprising:
providing a base substrate comprising a base substrate conductive structure;
providing a first electronic component over a first side of the base substrate;
providing a vertical interconnect over the first side of the base substrate and coupled with the base substrate conductive structure;
providing an encapsulant over the first side of the base substrate, wherein the encapsulant contacts a lateral side of the first electronic component and the vertical interconnect; and
providing an interposer substrate over a first side of the encapsulant and comprising an interposer substrate conductive structure, wherein the interposer substrate conductive structure is coupled with the vertical interconnect;
wherein:
a first one of the base substrate or the interposer substrate comprises a redistribution layer (RDL) substrate comprising a coreless substrate; and
a second one of the base substate or the interposer substrate comprises a laminate substrate comprising a printed circuit board.

14. The method of claim 13, further comprising providing an underfill between the first electronic component and the base substrate, and between the encapsulant and the base substrate, wherein the base substrate comprises prepreg.

15. The method of claim 13, further comprising an underfill between the encapsulant and the interposer substrate.

16. The method of claim 13, further comprising providing a second electronic component coupled with a second side of the base substrate opposite to the first side of the base substrate and coupled with the base substrate conductive structure.

17. The method of claim 13, wherein:
the interposer substrate comprises the RDL substrate;
providing the interposer substrate comprises forming the RDL substrate on a carrier; and
providing the first electronic component comprises coupling the first electronic component with the RDL substrate prior to removing the carrier.

18. The method of claim 17, further comprising coupling the first electronic component with the interposer substrate with an adhesive.

19. The method of claim 13, further comprising removing a portion of the encapsulant to expose a top end of the vertical interconnect prior to providing the interposer substrate.

20. The method of claim 13, further comprising removing a portion of the encapsulant to expose a component terminal of the first electronic component prior to providing the base substrate.

21. A method to manufacture an electronic device, comprising:
providing a first substrate comprising a first substrate conductive structure, wherein the first substrate comprises a redistribution layer (RDL) substrate;
providing a vertical interconnect over a first side of the first substrate and coupled with the first substrate conductive structure;
providing an electronic component over the first substrate and coupled with the first substrate;
providing an encapsulant over the first side of the first substrate and contacting a lateral side of the electronic component and the vertical interconnect;
coupling the vertical interconnect with a second conductive structure of a second substrate; and
providing an underfill between the electronic component and the second substrate; wherein:
a first one of the first substrate or the second substrate comprises a redistribution layer (RDL) substrate comprising a coreless substrate; and
a second one of the first substrate or the second substrate comprises a laminate substrate comprising a printed circuit board.

22. The method of claim 21, wherein the second substrate comprises a laminate substrate comprising prepreg.

* * * * *